United States Patent
Shibata et al.

(10) Patent No.: US 9,305,863 B2
(45) Date of Patent: Apr. 5, 2016

(54) SEMICONDUCTOR DEVICE

(71) Applicant: PANASONIC CORPORATION, Osaka (JP)

(72) Inventors: Hidenori Shibata, Toyama (JP); Junichi Shimada, Shiga (JP); Hiromasa Fukazawa, Hyogo (JP)

(73) Assignee: Panasonic Corporation, Osaka (JP)

(*) Notice: Subject to any disclaimer, the term of this patent is extended or adjusted under 35 U.S.C. 154(b) by 480 days.

(21) Appl. No.: 13/722,969

(22) Filed: Dec. 20, 2012

(65) Prior Publication Data

US 2013/0105990 A1 May 2, 2013

Related U.S. Application Data

(63) Continuation of application No. PCT/JP2012/001678, filed on Mar. 12, 2012.

(30) Foreign Application Priority Data

May 20, 2011 (JP) ................... 2011-113981

(51) Int. Cl.
*H01L 23/48* (2006.01)
*H01L 23/52* (2006.01)
*H01L 29/40* (2006.01)
*H01L 27/02* (2006.01)
*H01L 23/522* (2006.01)

(52) U.S. Cl.
CPC ............ *H01L 23/481* (2013.01); *H01L 23/522* (2013.01); *H01L 27/0207* (2013.01); *H01L 2924/0002* (2013.01)

(58) Field of Classification Search
USPC .................. 257/758, 226, 773, 750, 620, 774
See application file for complete search history.

(56) References Cited

U.S. PATENT DOCUMENTS

| | | | |
|---|---|---|---|
| 2004/0084777 A1* | 5/2004 | Yamanoue et al. | 257/758 |
| 2004/0188849 A1 | 9/2004 | Suga | |
| 2005/0269702 A1* | 12/2005 | Otsuka | H01L 21/76801 257/750 |
| 2006/0022224 A1* | 2/2006 | Hiroi | 257/226 |
| 2007/0200245 A1 | 8/2007 | Suga | |
| 2007/0262454 A1* | 11/2007 | Shibata | 257/758 |

(Continued)

FOREIGN PATENT DOCUMENTS

| | | |
|---|---|---|
| JP | 06-085080 A | 3/1994 |
| JP | 08-097290 A | 4/1996 |

(Continued)

OTHER PUBLICATIONS

International Search Report mailed Apr. 17, 2012 issued in International Application No. PCT/JP2012/001678.

*Primary Examiner* — Marc Armand
*Assistant Examiner* — Wilner Jean Baptiste
(74) *Attorney, Agent, or Firm* — McDermott Will & Emery LLP

(57) ABSTRACT

A first dummy via pattern having high density is arranged in the vicinity of first and second wirings on a semiconductor device, and a second dummy via pattern having low density is arranged in a distant region from the first and second wirings, with reference to the first dummy via pattern. Accordingly, it is possible to suppress expansion of the file size of layout CAD data due to dummy vias, while complying with a design standard regulated for each semiconductor process, regardless of the presence or absence of vias which connect the first wirings to the second wirings.

22 Claims, 27 Drawing Sheets

(56) References Cited

U.S. PATENT DOCUMENTS

| | | | |
|---|---|---|---|
| 2008/0036042 A1* | 2/2008 | Sano et al. ................ | 257/620 |
| 2008/0169486 A1* | 7/2008 | Toyoshima ......... | H01L 27/0251 257/203 |
| 2008/0237870 A1 | 10/2008 | Nakao et al. | |
| 2009/0146310 A1* | 6/2009 | Ohno et al. ................ | 257/773 |
| 2009/0230562 A1* | 9/2009 | Kondou et al. ............ | 257/774 |
| 2010/0270686 A1 | 10/2010 | Nakao et al. | |

FOREIGN PATENT DOCUMENTS

| | | |
|---|---|---|
| JP | 2002-261162 A | 9/2002 |
| JP | 2004-296864 A | 10/2004 |
| JP | 2005-072403 A | 3/2005 |
| JP | 2008-066716 A | 3/2008 |
| JP | 2008-124070 A | 5/2008 |
| WO | WO-2005/096364 A1 | 10/2005 |

* cited by examiner

SEMICONDUCTOR DEVICE

RELATED APPLICATIONS

This application is a Continuation of International Application No. PCT/JP2012/001678, filed on Mar. 12, 2012, which in turn claims the benefit of Japanese Application No. 2011-113981, filed on May 20, 2011, the disclosures of which Applications are incorporated by reference herein.

BACKGROUND

1. Technical Field

The present invention relates to a via arrangement structure of a semiconductor device having a multi-layered wiring layer.

2. Background Art

In recent years, for high speed performance of a semiconductor device such as an LSI (Large Scale Integrated circuit), an interlayer insulation film having a low dielectric constant (Low-k), which forms a multilayer wiring of the semiconductor device, has been actively developed. In general, the film having the low dielectric constant is formed by decreasing the density of a material used in the film or by removing the polarity of the material used in the film. However, in the film formed in this way, physical properties such as Young's modulus are generally deteriorated, and thus, the mechanical strength is decreased.

Further, conventionally, a CMP (Chemical-Mechanical Polishing) process has been widely used in the formation of a wiring layer. In the CMP process, in order to secure flatness of the wiring layer, a wiring which electrically functions as a circuit and a dummy wiring which does not electrically function as the circuit are formed. The dummy wiring functions not only to secure the flatness, but also to secure the mechanical strength of the interlayer insulation film according to the recent interlayer insulation film having lowered k.

Further, in a case where the Low-k material is also used in a via layer between upper and lower wiring layers, the mechanical strength of the via layer also causes a problem. That is, the mechanical strength of the multilayer wiring in the stacking direction (longitudinal direction) is decreased, which may damage reliability of the wiring. Thus, a dummy via which does not electrically function as a circuit is also provided in the via layer between the upper and lower wiring layers. The dummy via is not connected to the wiring which forms the circuit, but is connected to the dummy wiring. Further, in general, a dummy via design standard which is regulated by a design standard or the like determined for each semiconductor process is regulated by the density per unit area, the presence or absence of a dummy wiring positioned in the upper and lower layers of the dummy via, the overhang amount with respect to the dummy wiring, and the like, in a similar way to the dummy wiring.

In this regard, in general, the density of the sum of dummy vias and vias is not as high as the density (for example, 20% to 80%) of the sum of the dummy wiring and the wiring. Further, a design standard relating to the density of the sum of the dummy vias and the vias provides a relatively small value with only a restriction of a lower limit value which is greater than 0.1%, for example. In general, in order to comply with the design standard, the dummy via is disposed in an overlap region between two layers of the upper and lower wiring layers.

Further, in general, the shape of the dummy wiring is a shape in which a line and a space are repeated, in a similar way to the wiring. Further, in a case where the extension directions of two layers of the respective upper and lower dummy wirings are orthogonal to each other, the dummy vias are arranged with a uniform pitch in a matrix direction within a range where a design standard relating to an interval between vias or the like is complied with, in an overlap region formed by intersection of the dummy wirings orthogonal to each other in the upper and lower layers.

PTL1 discloses an example of a technique in which dummy contacts are provided to suppress the loading effect. Further, PTL2 discloses an example of a technique in which dummy vias or dummy contacts are arranged to reduce via defects or contact defects.

CITATION LIST

Patent Literatures

PTL 1: Unexamined Japanese Patent Publication No. H06-85080

PTL 2: Unexamined Japanese Patent Publication No. H08-97290

SUMMARY

When dummy vias are arranged so as to comply with a design standard relating to the density of the sum of the dummy vias and vias, it is necessary to arrange the dummy vias in considerably high density, in consideration of a case where a via which connects wirings is not present in a peripheral circuit where the dummy vias are arranged. Specifically, for example, in a case where there is a region where vias are almost not present while wirings which form a circuit are concentrated, in a region which includes the periphery thereof, the density of the sum of the dummy vias and the vias is excessively decreased. Thus, it is necessary to considerably increase the density of the dummy vias arranged in a dummy wiring to secure the density of the sum of the dummy vias and the vias.

However, in a case where the dummy vias are arranged in high density, the number of the arranged dummy vias excessively increases, and thus, the file size of layout CAD data which represents the dummy via pattern is disadvantageously expanded. Consequently, in a design process after the dummy via pattern is arranged, for example, there is a problem that a long time is necessary for data reading and writing with respect to a disk system which stores the layout CAD data, or a problem that the file size is too large to be stored on the disk system.

According to an aspect of the present invention, there is provided a semiconductor device including a substrate, and first and second wiring layers formed on the substrate, including: a first wiring formed in the first wiring layer; an interlayer insulation film formed between the first wiring layer and the second wiring layer; and a second wiring formed in the second wiring layer. Further, the semiconductor device includes a via formed through the interlayer insulation film and connecting the first wiring to the second wiring; a first dummy wiring formed in the first wiring layer; a second dummy wiring formed in the second wiring layer; and a dummy via which is formed through the interlayer insulation film and connecting the first dummy wiring to the second dummy wiring. Further, a density of a first dummy via pattern which includes a plurality of dummy vias and is arranged in the vicinity of the first and second wirings is higher than a density of a second dummy via pattern which includes a plurality of dummy vias and is arranged in a distant region, with reference to the first dummy via pattern, from the first and second wirings.

According to this aspect of the present invention, the first dummy via pattern having high density is arranged in the vicinity of the first and second wirings, and the second dummy via pattern having low density is arranged in the distant region from the first and second wirings, with reference to the first dummy via pattern. Accordingly, it is possible to comply with a design standard regulated for each semiconductor process, without arrangement of the dummy via according to the presence or absence of the via which connects the first wiring and the second wiring, that is, without surplus arrangement of the dummy via in a region where the number of vias is small. That is, it is possible to suppress expansion of the file size of layout CAD data which represents the dummy via, while complying with the design standard regulated for each semiconductor process.

DESCRIPTION OF EMBODIMENTS

Concept of the Invention

Figure 26:
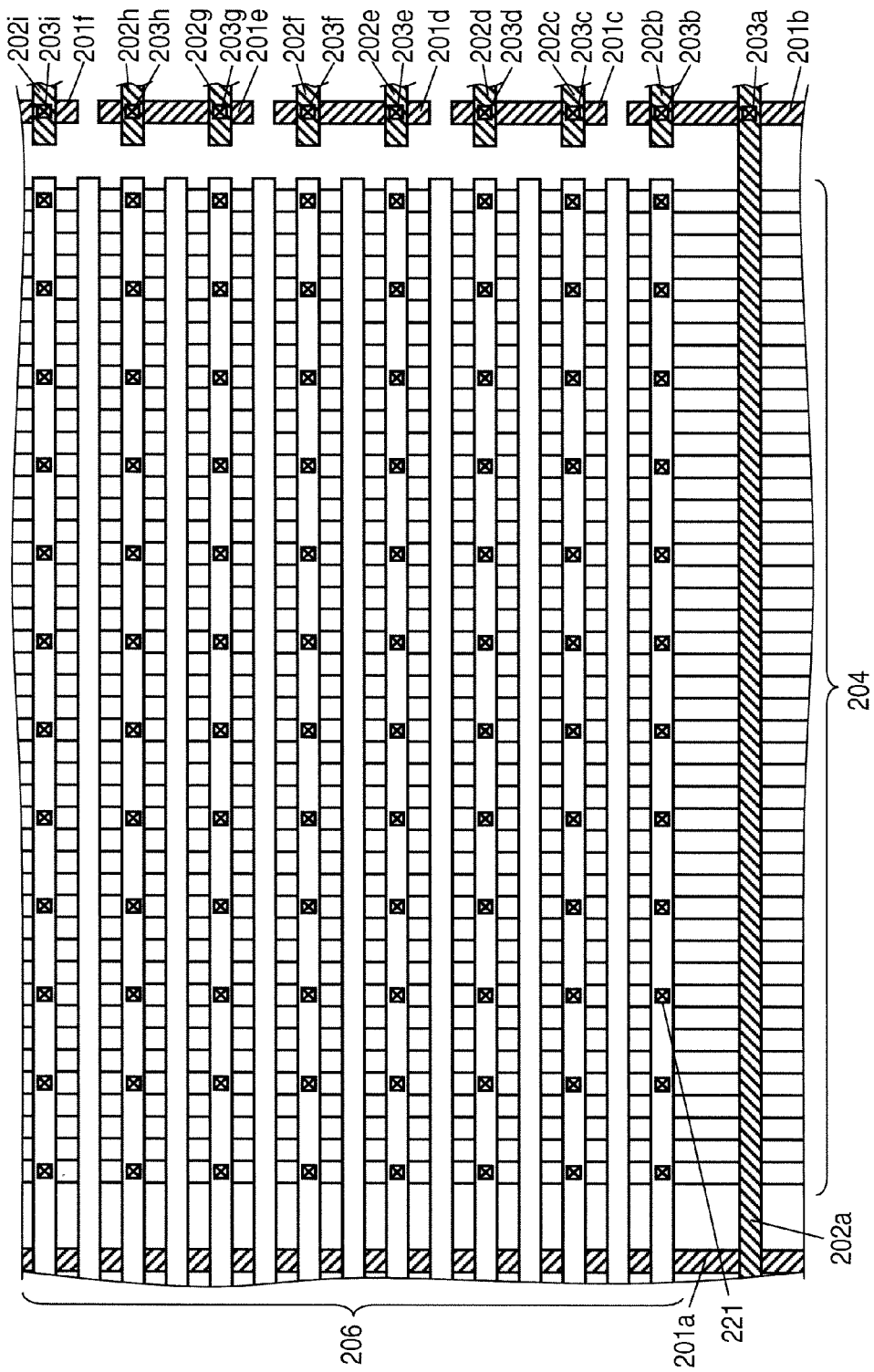
FIG. 26 is a plan view illustrating a typical wiring layout in a case where a semiconductor device is seen from above, for description of the present invention.
Figure 27:
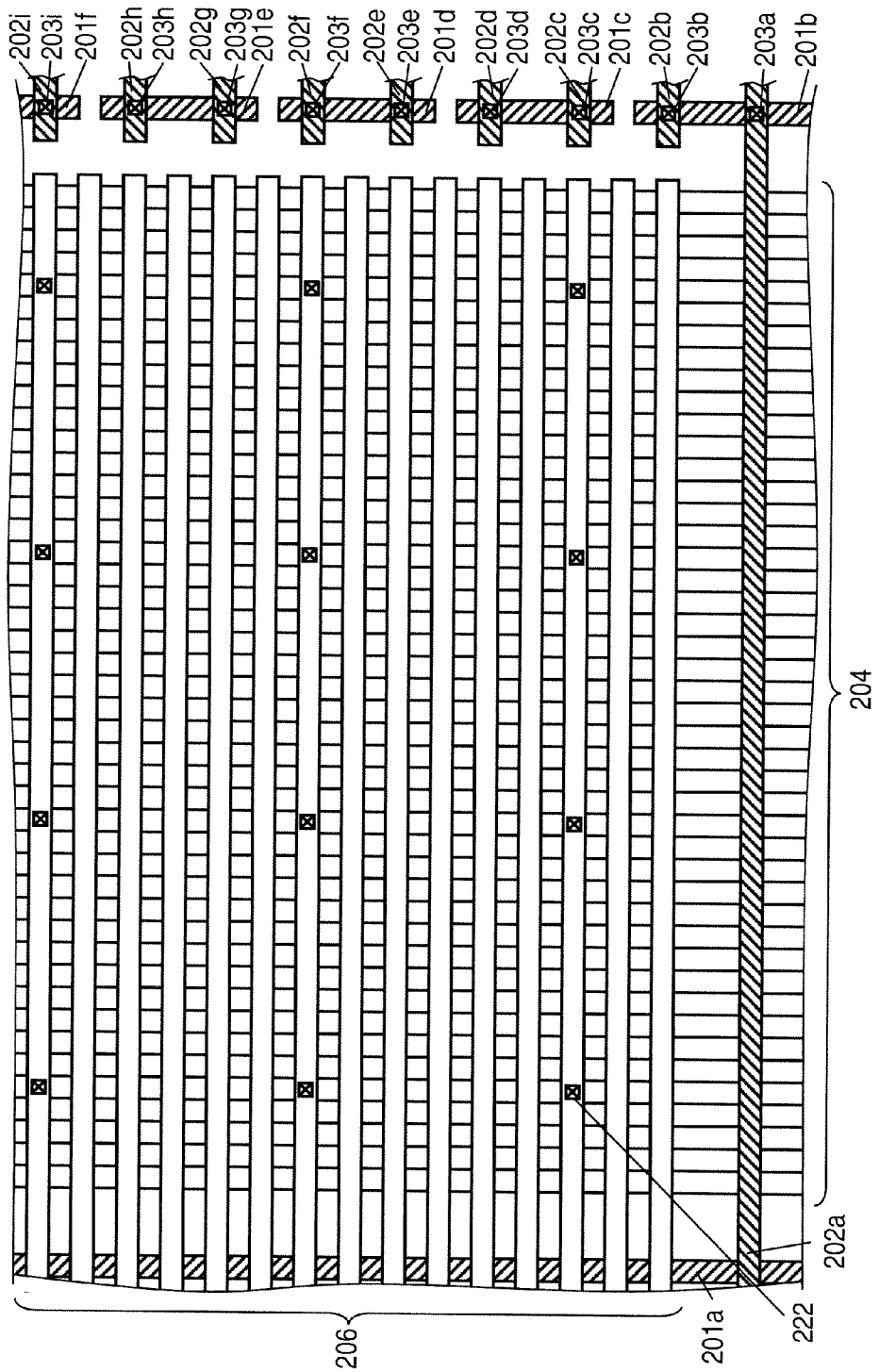
FIG. 27 is a plan view illustrating another example of the typical wiring layout in a case where the semiconductor device is seen from above, for description of the present invention.

FIGS. 26 and 27 are plan views illustrating typical wiring layouts in a case where a semiconductor device is seen from above, for description of the present invention.

The wiring layout in FIG. 26 includes first wirings 201a to 201f formed in a first wiring layer, and first dummy wiring pattern 204 formed in a gap portion of first wirings 201a to 201f in the first wiring layer. Further, the wiring layout includes second wirings 202a to 202i formed in a second wiring layer, second dummy wiring pattern 206 formed in a gap portion of second wirings 202a to 202i in the second wiring layer, vias 203a to 203i, and dummy via pattern 221. Although not illustrated in FIG. 26, an interlayer insulation film is formed between the first wiring layer and the second wiring layer.

Vias 203a to 203i are formed through the interlayer insulation film between the first wiring layer and the second wiring layer, and connect first wirings 201a to 201f to second wirings 202a to 202i.

Dummy via pattern 221 is formed through the interlayer insulation film between the first wiring layer and the second wiring layer, and connects first dummy wiring pattern 204 to second dummy wiring pattern 206.

In FIG. 26, a via is not disposed in first wiring 201a. Accordingly, the density per unit area of vias in a peripheral region of first wiring 201a is 0 (zero). Thus, in order to improve the via area ratio obtained by combining vias and dummy vias, it is necessary to arrange dummy via pattern 221 in high density.

Dummy via pattern 221 illustrated in FIG. 26 is an example in which the arrangement interval is set to be narrow for arrangement so as to increase the density of the dummy vias in a range where a design standard determined for each semiconductor process is complied with. Here, when the distance between the centers of adjacent overlap regions among overlap regions of first dummy wiring pattern 204 and second dummy wiring pattern 206 is defined as 1 pitch, in dummy via pattern 221, the distance between the dummy vias is set to 2 pitches and the dummy vias are arranged with a uniform pitch every 2 pitches.

Thus, the number of the arranged dummy vias excessively increases, and thus, the file size of layout CAD data which represents dummy via pattern 221 is expanded. For example, if the layout CAD data is stored using a GDSII format which is one typical layout CAD data format, several tens of gigabytes may be used as data in a chip size level. Thus, in a design process after dummy via pattern 221 is arranged, for example, there is a problem that a long time is necessary for reading and writing with respect to a disk system on which the layout CAD data is stored, or a problem in which the file size is too large to be stored on the disk system.

FIG. 27 illustrates an example in which dummy vias having a minimum low density which satisfies the design standard determined for each semiconductor process in the overlap region of first and second dummy wiring patterns 204 and 206, as the density of dummy vias per unit area, are arranged to suppress expansion of the file size of the layout CAD data which represents the dummy via pattern. Specifically, in FIG. 27, the arrangement pitch of the dummy vias in dummy via pattern 222 is changed from 2 pitches in FIG. 26 to 6 pitches.

Accordingly, compared with dummy via pattern 221 illustrated in FIG. 26, in dummy via pattern 222, in the same area, the number of dummy vias is reduced to one ninth, and expansion of the file size of the layout CAD data which represents dummy via pattern 222 is suppressed. However, a problem occurs that while the density of the sum of dummy vias and vias per unit area satisfies the design standard in the vicinity of the wiring where vias 203a to 203i are present as in first wirings 201b to 201f and second wirings 202b to 202i, the density of the sum of vias and dummy vias per unit area cannot comply with the design standard in the vicinity of the wiring where a via is not present as in first wiring 201a and second wiring 202a.

That is, in the wiring layouts illustrated in FIGS. 26 and 27, if the dummy vias are arranged to comply with the design standard of the density of the sum of dummy vias and vias per unit area, the file size of the layout CAD data is expanded, and on the other hand, if the dummy vias are arranged to suppress expansion of the file size of the layout CAD, it is difficult to comply with the design standard of the density of the sum of dummy vias and vias per unit area.

Thus, according to an aspect of the present invention, there is provided a semiconductor device including a substrate, and first and second wiring layers formed on the substrate, including: a first wiring formed in the first wiring layer; an interlayer insulation film formed between the first wiring layer and the second wiring layer; and a second wiring formed in the second wiring layer. Further, the semiconductor device includes a via formed through the interlayer insulation film and connects the first wiring to the second wiring; a first dummy wiring formed in the first wiring layer; a second dummy wiring formed in the second wiring layer; and a dummy via which is formed through the interlayer insulation film and connects the first dummy wiring to the second dummy wiring. Further, the density of a first dummy via pattern which includes the plurality of dummy vias and is arranged in the vicinity of the first and second wirings, is higher than the density of a second dummy via pattern which includes the plurality of dummy vias and is arranged in a distant region, with reference to the first dummy via pattern, from the first and second wirings.

According to this aspect of the present invention, the first dummy via pattern having high density is arranged in the vicinity of the first and second wirings, and the second dummy via pattern having low density is arranged in the distant region from the first and second wirings, with reference to the first dummy via pattern. Accordingly, even in a case where there is a region where the number of the vias which connect the first wiring to the second wiring is small, since the density of the dummy vias arranged in the vicinity of the first wiring and the second wiring is high, it is possible to comply with a design standard relating to the density of the sum of the vias and the dummy vias regulated by a design standard or the like for each semiconductor process. On the other hand, in the distant region from the first and second wirings with reference to the first dummy via pattern, the density of the dummy vias is low. That is, in the distant region where the density is low with reference to the first dummy via pattern, it is possible to suppress expansion of layout CAD data which represents the dummy via pattern. Thus, it is possible to comply with the design standard regulated for each semiconductor process, without surplus arrangement of the dummy vias, regardless of the presence and absence of the vias which connect the first wiring to the second wiring and the density of the vias which connect the first wiring to the second wiring in a predetermined region. That is, it is possible to suppress expansion of the file size of the layout CAD data which represents the dummy via pattern, while complying with the design standard regulated for each semiconductor process.

Further, in the semiconductor device according to the aspect of the present invention, it is preferable that the distance between the respective dummy vias which form the first dummy via pattern be shorter than the distance between the respective dummy vias which form the second dummy via pattern.

Further, it is preferable that the semiconductor device according to the aspect of the present invention include a first dummy wiring pattern which includes the plurality of first dummy wirings arranged in parallel with a uniform pitch.

Further, it is preferable that the semiconductor device according to the aspect of the present invention include a second dummy wiring pattern which includes the plurality of second dummy wirings arranged in parallel with a uniform pitch.

Further, in the semiconductor device according to the aspect of the present invention, it is preferable that the first and second dummy wirings have a rectangular shape and be arranged in a matrix form with a uniform pitch.

Further, in the semiconductor device according to the aspect of the present invention, it is preferable that the center of an overlap region of the first dummy wiring and the second dummy wiring coincide with the center of the dummy via.

Hereinafter, exemplary embodiments of the present invention will be described with reference to the accompanying drawings.

First Exemplary Embodiment

Figure 1:
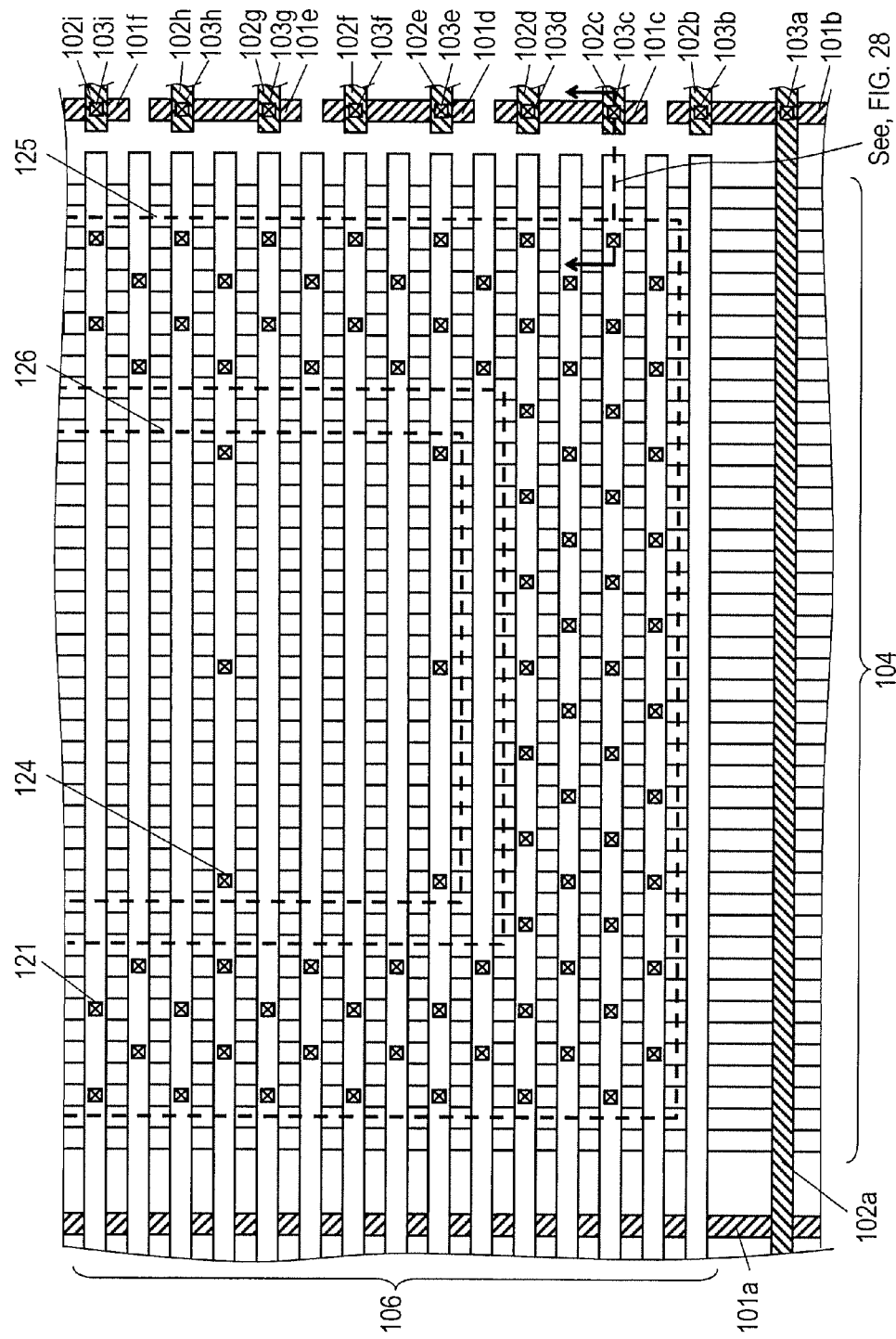
FIG. 1 is a plan view illustrating a wiring layout in a case where a semiconductor device according to a first exemplary embodiment is seen from above.

FIG. 1 is a plan view illustrating a wiring layout in a case where a semiconductor device (semiconductor integrated circuit) according to a first exemplary embodiment of the present invention is seen from above.

Figure 28:
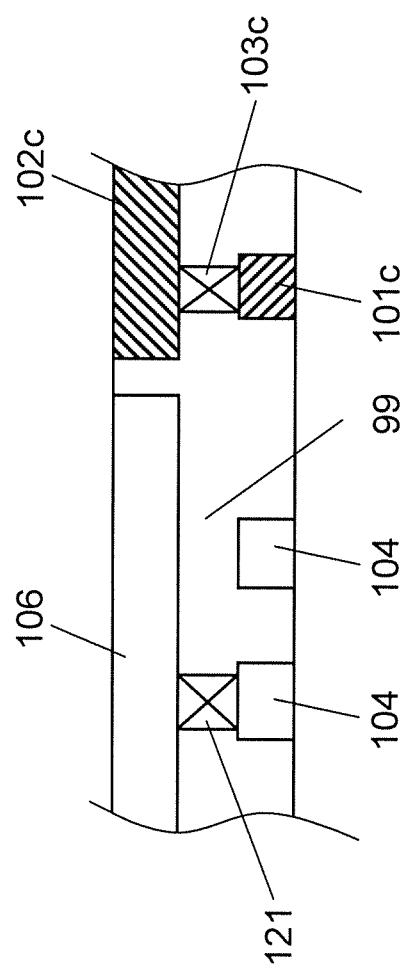
FIG. 28 is a cross sectional view corresponding to the broken line of FIG. 1.

The wiring layout in FIG. 1 includes first wirings 101a to 101f formed in a first wiring layer; and first dummy wiring pattern 104 which is formed in a gap portion of first wirings 101a to 101f in the first wiring layer, includes a plurality of first dummy wirings, and does not electrically function as a circuit. Further, the wiring layout includes second wirings 102a to 102i formed in a second wiring layer; second dummy wiring pattern 106 which is formed in a gap portion of a second wiring pattern in a second wiring layer, includes a plurality of second dummy wirings, and does not electrically function as a circuit; vias 103a to 103i; and first and second dummy via patterns 121 and 124 including the plurality of dummy vias. As shown in FIG. 28, an interlayer insulation film 99 is formed between the first wiring layer and the second wiring layer. Further, first wirings 101a to 101f, second wirings 102a to 102i, and vias 103a to 103i respectively represent a part of the first and second wiring patterns and the via pattern which form the circuit. Here, it is assumed that first wirings 101a to 101f and second wirings 102a to 102i are formed with a minimum size and a minimum interval regulated by a design standard or the like for each semiconductor process.

Vias 103a to 103i are formed through the interlayer insulation film between the first wiring layer and the second wiring layer, and connects first wirings 101a to 101f to second wirings 102a to 102i.

First dummy via pattern 121 is arranged in first dummy via pattern arrangement region 125 which is a region in the vicinity of first wirings 101a to 101f and second wirings 102a to 102i, and is formed through the interlayer insulation film between the first wiring layer and the second wiring layer and connects first dummy wiring pattern 104 to second dummy wiring pattern 106.

Second dummy via pattern 124 is arranged in second dummy via pattern arrangement region 126 which is a distant region, with reference to first dummy via pattern arrangement region 125, from first wirings 101a to 101f and second wirings 102a to 102i, and is formed through the interlayer insulation film between the first wiring layer and the second wiring layer and connects first dummy wiring pattern 104 to second dummy wiring pattern 106.

Here, first and second dummy via patterns 121 and 124 do not electrically function as the circuit, in a similar way to first and second dummy wiring patterns 104 and 106.

Figure 2:
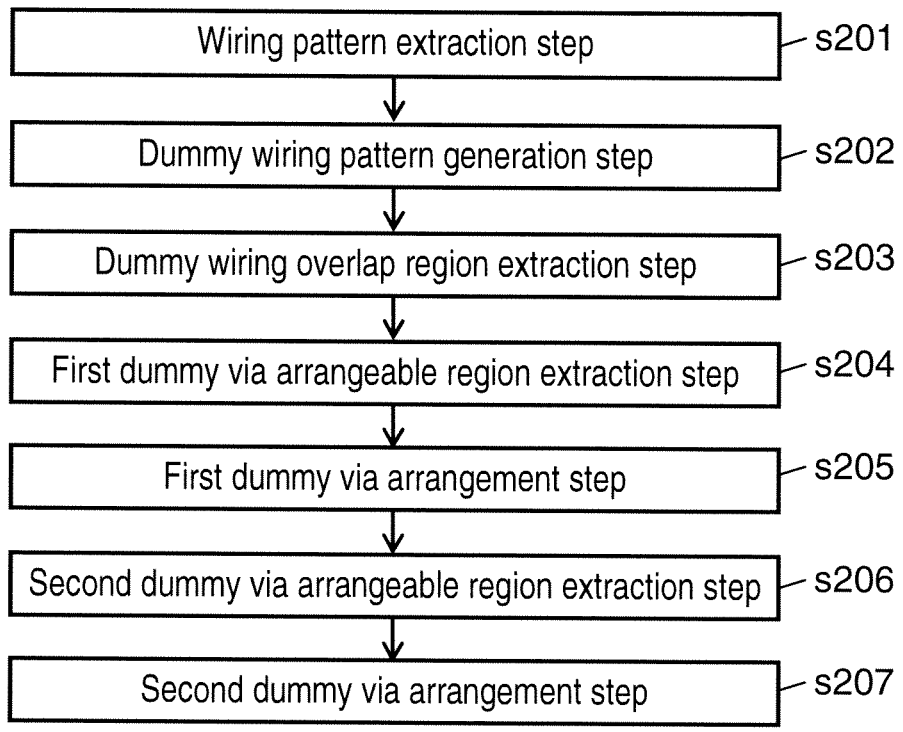
FIG. 2 is a flowchart illustrating a wiring auxiliary pattern generating method according to the first exemplary embodiment.

FIG. 2 is a flowchart illustrating a wiring auxiliary pattern generating method according to the first exemplary embodiment. Further, FIG. 3 is a flowchart illustrating details of a first dummy via arrangeable region extraction step (S204) in FIG. 2.

Figure 3:
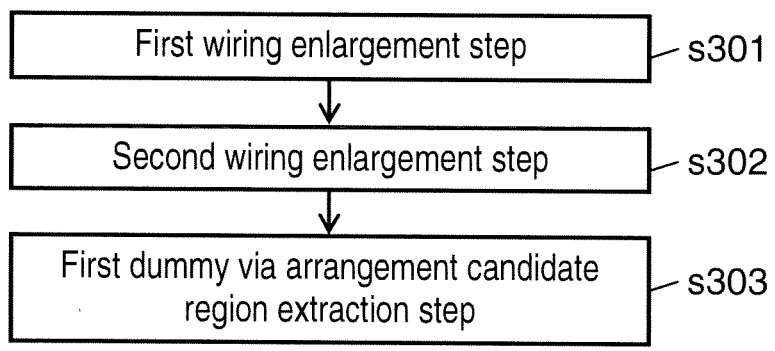
FIG. 3 is a flowchart illustrating details of a first dummy via arrangeable region extraction step, in the wiring auxiliary pattern generating method according to the first exemplary embodiment.

Here, the respective steps of the wiring auxiliary pattern generating method illustrated in FIG. 2 and FIG. 3 are performed using an analysis tool (for example, layout verification tool) or the like which causes data processing to be executed in a computer. For example, the layout verification tool is a tool for verifying whether the size or the like of a semiconductor layout pattern satisfies the design standard.

Figure 4:
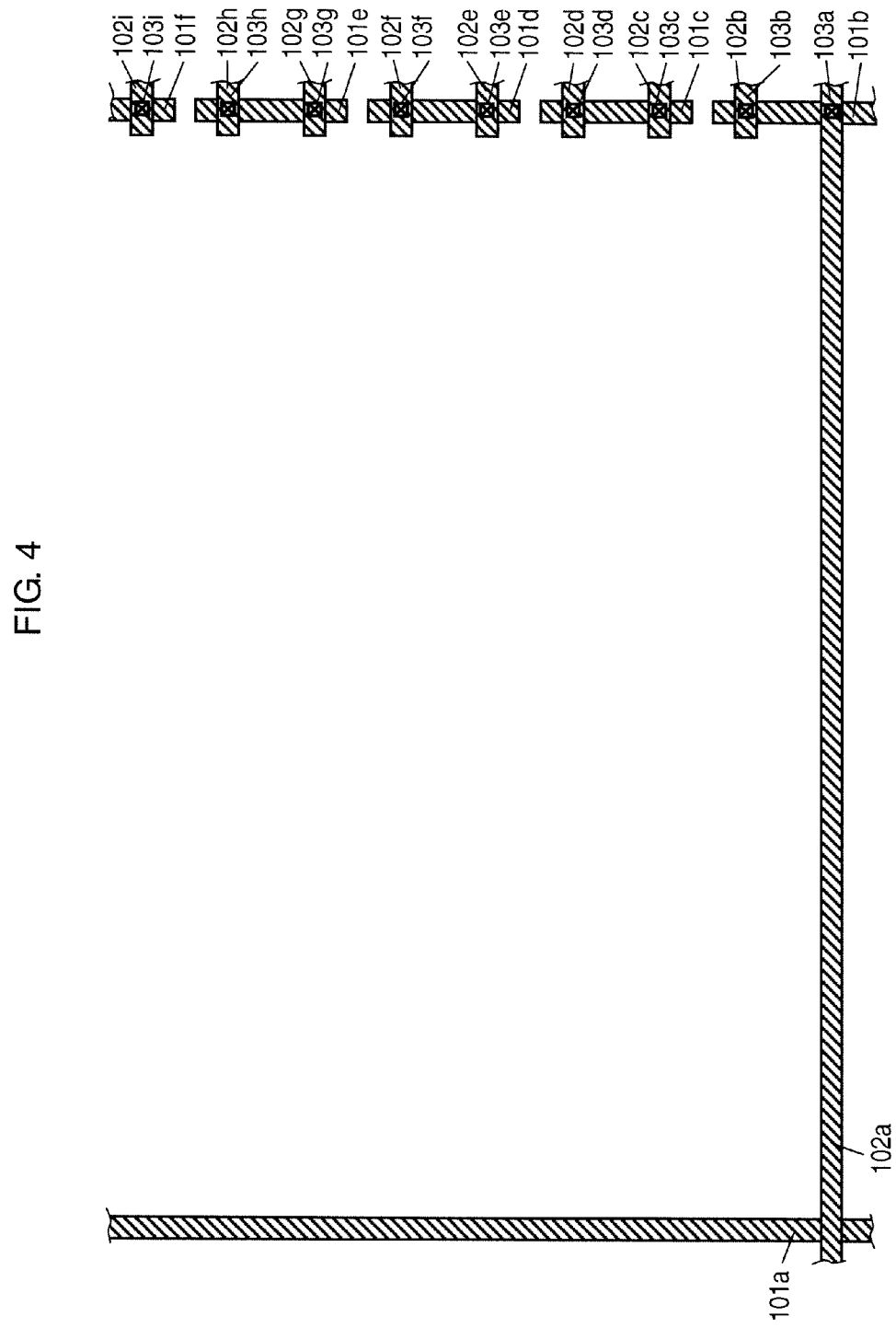
FIG. 4 is a diagram illustrating a procedure of the wiring auxiliary pattern generating method according to the first exemplary embodiment.

Step S201 corresponds to a wiring pattern extraction step, in which first wirings 101a to 101f and second wirings 102a to 102i are extracted from a file in which design information is stored. For example, layout CAD data which includes wiring layout information of a semiconductor device is inputted into a computer on which the analysis tool is installed and a wiring pattern of a corresponding region is extracted. Specifically, as illustrated in FIG. 4, in the first wiring layer, first wirings 101a to 101f are extracted, and in the second wiring layer, second wirings 102a to 102i are extracted.

Figure 5:
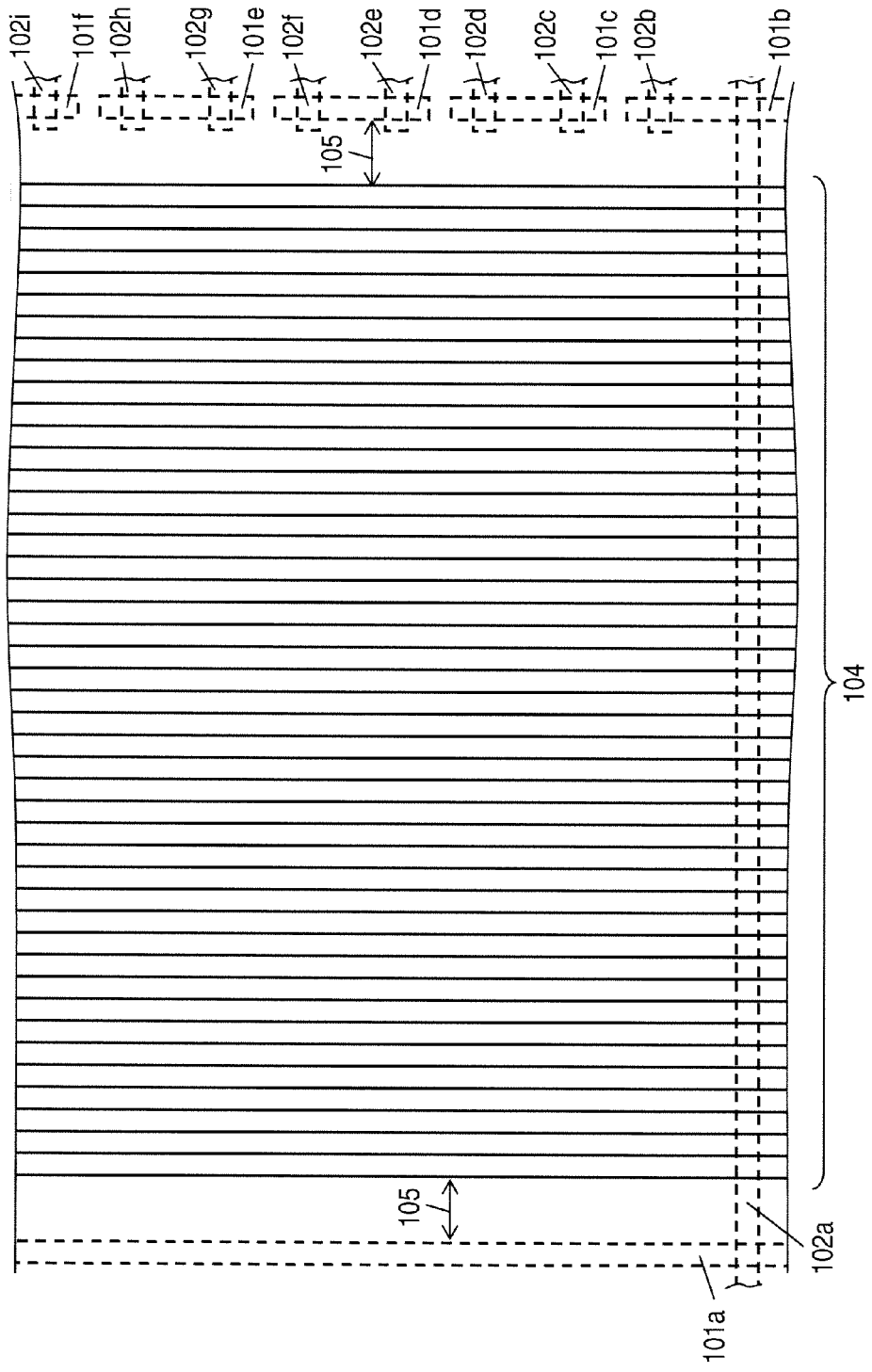
FIG. 5 is a diagram illustrating a procedure of the wiring auxiliary pattern generating method according to the first exemplary embodiment.
Figure 6:
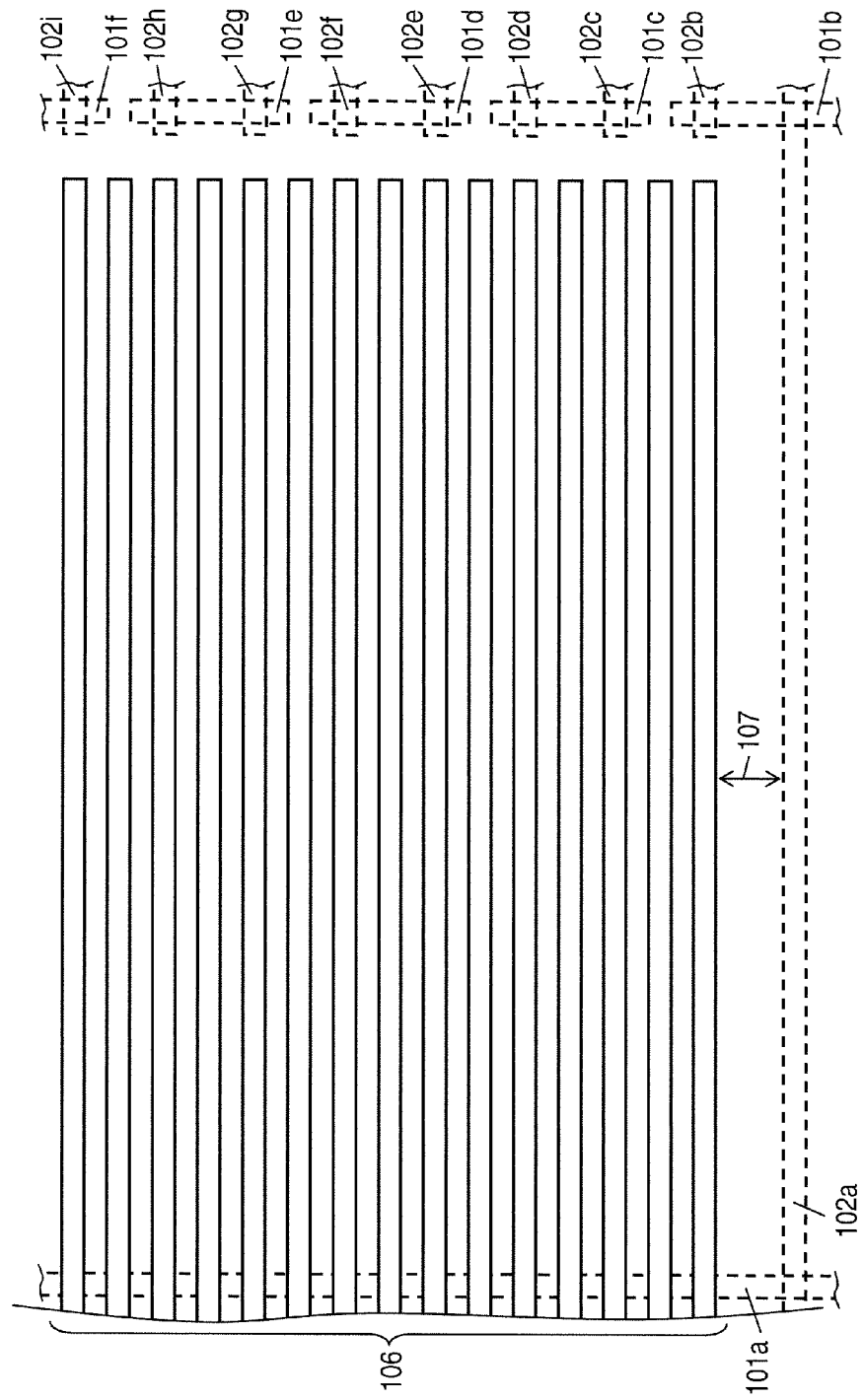
FIG. 6 is a diagram illustrating a procedure of the wiring auxiliary pattern generating method according to the first exemplary embodiment.

Next, step S202 corresponds to a dummy wiring pattern generation step. As illustrated in FIG. 5, in a gap portion where first wirings 101a to 101f extracted in step S201 are not formed, first dummy wiring pattern 104 which extends in the same direction as a priority arrangement direction (vertical direction) which is an extension direction of a majority of wirings in the first wiring layer is generated at an interval of first interval value 105 from first wirings 101a to 101f. Similarly, as illustrated in FIG. 6, in a gap portion where second wirings 102a to 102i extracted in step S201 are not formed, second dummy wiring pattern 106 which extends in the same direction as a priority arrangement direction (horizontal direction) which is an extension direction of a majority of wirings in the second wiring layer is generated at an interval of second interval value 107 from second wirings 102a to 102i.

Here, it is assumed that the priority wiring direction of the first wiring layer is orthogonal to the priority wiring direction of the second wiring layer, that is, first dummy wiring pattern 104 is orthogonal to second dummy wiring pattern 106, respectively.

The priority wiring direction of the first wiring layer and the priority wiring direction of the second wiring layer are not limited to the directions in the present exemplary embodiment. For example, the horizontal direction may be the priority wiring direction of the first wiring layer, or the priority wiring direction of the first wiring layer may be the same as the priority wiring direction of the second wiring layer. Here, it is preferable that the priority wiring direction of the first wiring layer be orthogonal to the priority wiring direction of the second wiring layer.

Further, it is preferable that first dummy wiring pattern 104 and second dummy wiring pattern 106 be arranged in parallel with each other with a uniform pitch and be formed with a minimum size and a minimum interval regulated by a design standard or the like for each semiconductor process, respectively. FIG. 5 and FIG. 6 show an example in which respective first and second dummy wiring patterns 104 and 106 are arranged in parallel with a uniform pitch and are formed with a minimum size and a minimum interval regulated by a design standard or the like for each semiconductor process. That is, in the present exemplary embodiment, first and second dummy wiring patterns 104 and 106 have a uniform wiring width. Further, as an example, a configuration may be considered in which the respective first dummy wirings which form first dummy wiring pattern 104 have a wiring width which is the same as the minimum wiring width among the wiring widths of the first wirings and a wiring interval which is the same as the minimum interval among the wiring intervals of the first wirings. Further, as another example, a configuration may be considered in which the respective second dummy wirings which form second dummy wiring pattern 106 have a wiring width which is the same as the minimum wiring width among the wiring widths of the second wirings and a wiring interval which is the same as the minimum interval among the wiring intervals of the second wirings.

Further, first and second interval values 105 and 107 represent intervals to be secured between the wiring pattern and the dummy wiring pattern and are values regulated by the design standard or the like for each semiconductor process, respectively. Further, first interval value 105 and second interval value 107 may have different values, which is not problematic.

Figure 7:
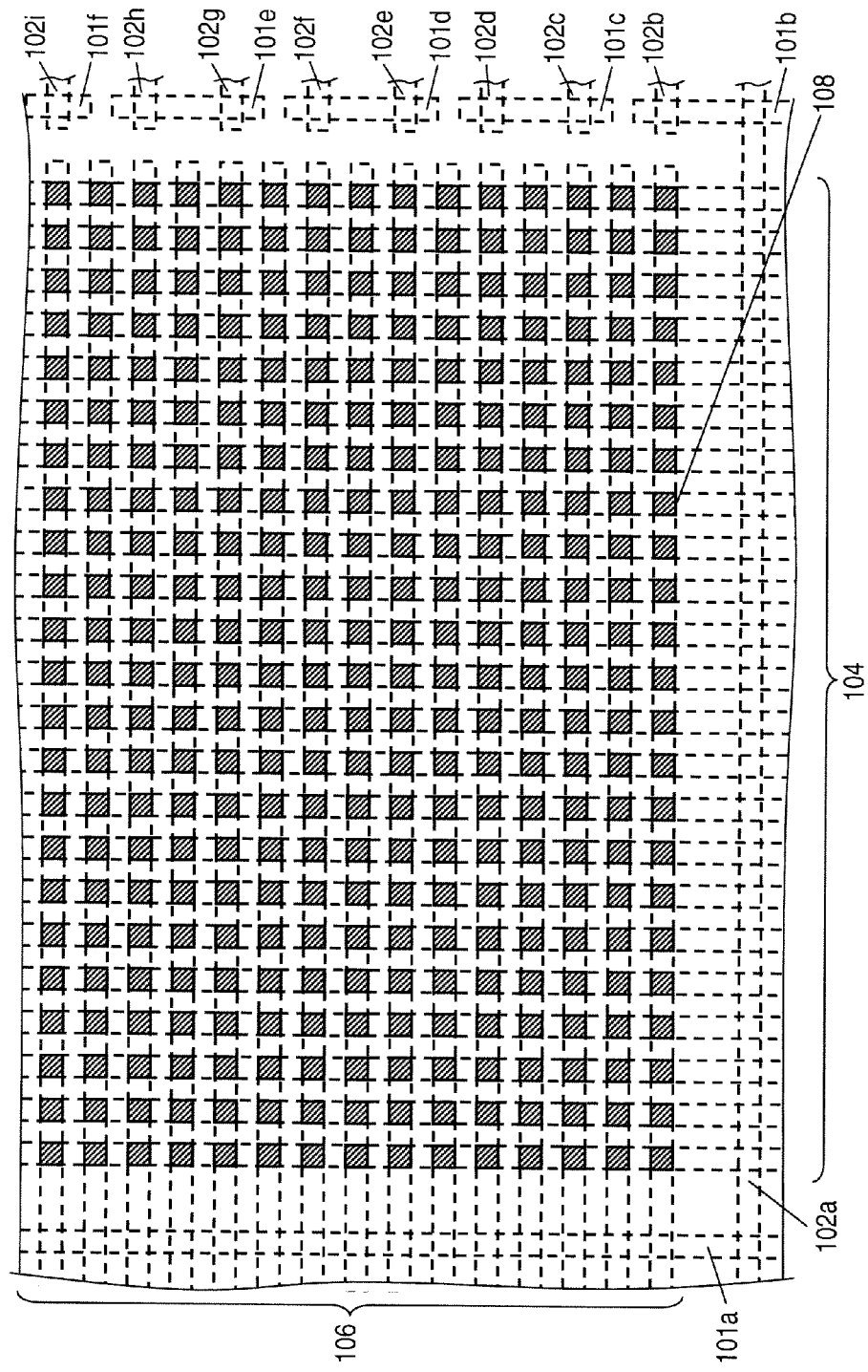
FIG. 7 is a diagram illustrating a procedure of the wiring auxiliary pattern generating method according to the first exemplary embodiment.

Next, step S203 corresponds to a dummy wiring overlap region extraction step, in which overlap region 108 between first dummy wiring pattern 104 and second dummy wiring pattern 106 outputted in step S202 is extracted, as illustrated in FIG. 7. Overlap region 108 corresponds to a region where first dummy wiring pattern 104 and second dummy wiring pattern 106 are present together. That is, overlap region 108 represents a region where first and second dummy via patterns 121 and 124 which physically connect first dummy wiring pattern 104 to second dummy wiring pattern 106 can be arranged.

Next, in step S204, in the vicinity of first wirings 101a to 101f and second wirings 102a to 102i extracted in step S201, first dummy via pattern arrangement region 125 where first dummy via pattern 121 can be arranged is extracted. Specifically, by using a value which defines a minimum interval of first wirings 101a to 101f and second wirings 102a to 102i and first dummy via pattern 121 and a value which defines an upper limit distance indicating the vicinity of first wirings 101a to 101f and second wirings 102a to 102i, first dummy via pattern arrangement region 125 which is the region in the vicinity of first wirings 101a to 101f and second wirings 102a to 102i is extracted.

Here, details of step S204 will be described with reference to FIG. 3 and FIGS. 8 to 14.

Step S204 includes steps S301 to S303, as illustrated in FIG. 3.

Figure 8:
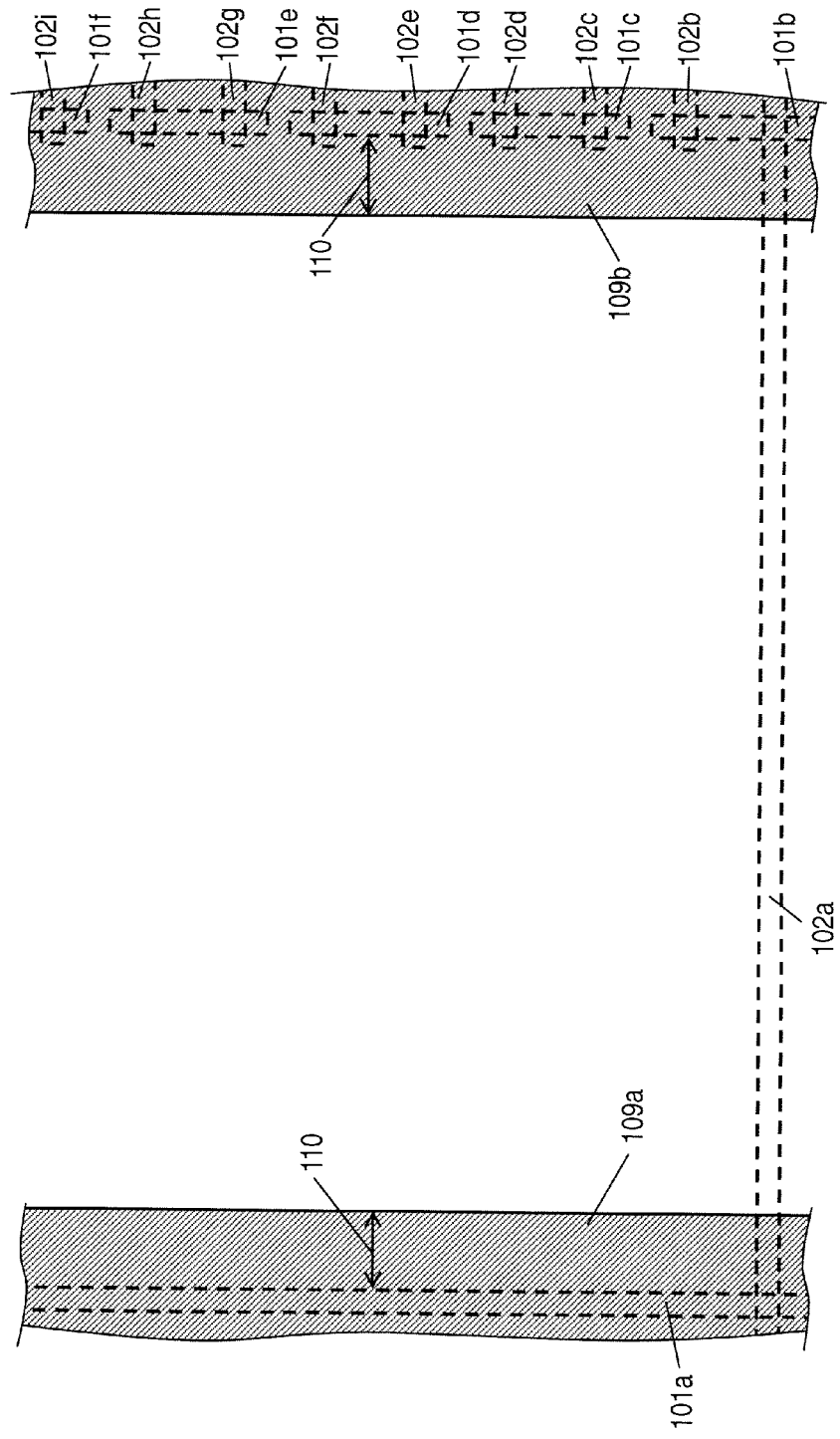
FIG. 8 is a diagram illustrating a procedure of the wiring auxiliary pattern generating method according to the first exemplary embodiment.
Figure 9:
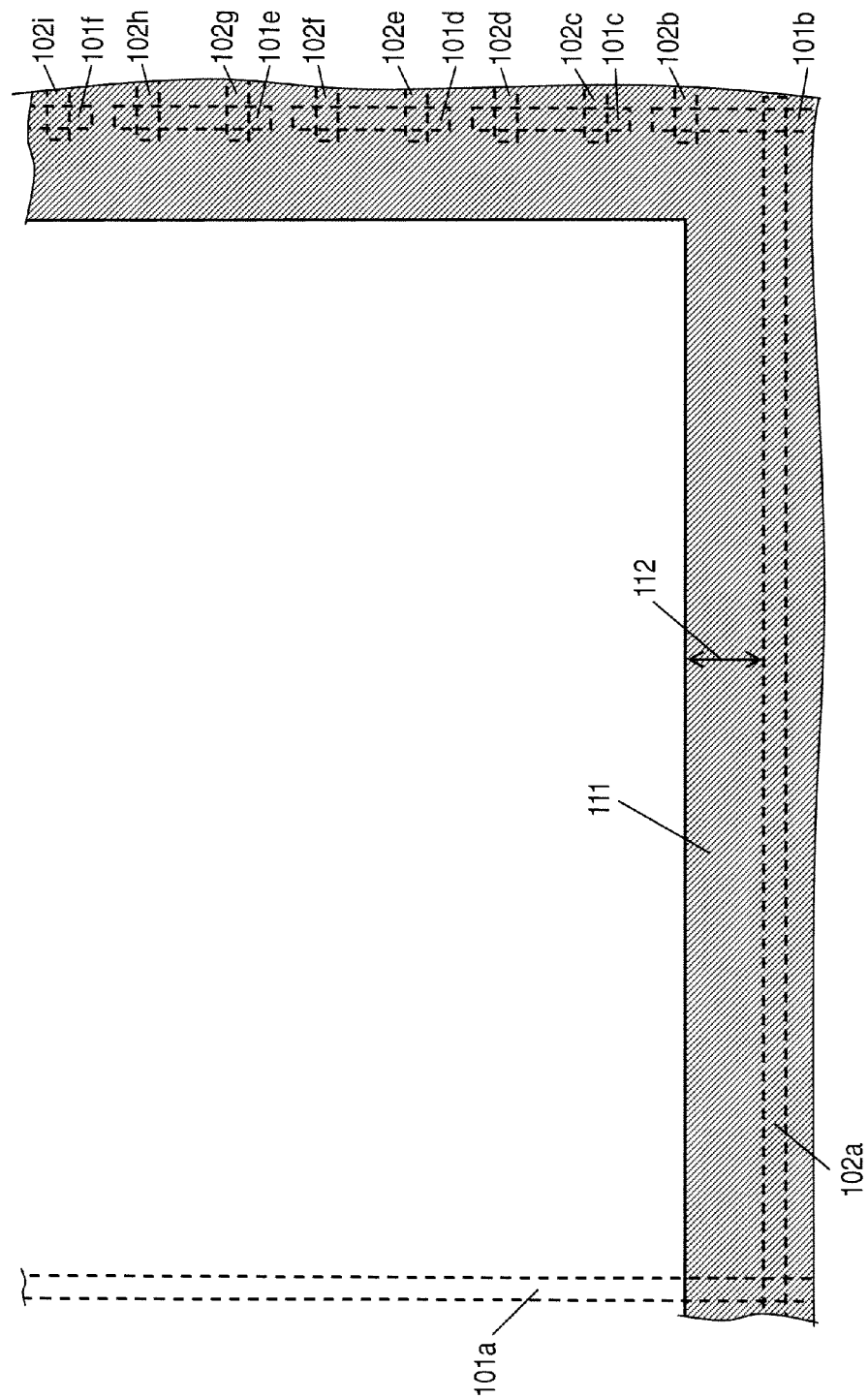
FIG. 9 is a diagram illustrating a procedure of the wiring auxiliary pattern generating method according to the first exemplary embodiment.

Step S301 corresponds to a first wiring enlargement step using the value which defines the minimum interval. Specifically, as illustrated in FIG. 8, an enlargement process is performed for first wirings 101a to 101f extracted in step S201 using third interval value 110 to output enlarged patterns 109a and 109b. Similarly, as illustrated in FIG. 9, an enlargement process is performed for second wirings 102a to 102i extracted in step S201 using fourth interval value 112 to output enlarged pattern 111.

Here, third and fourth interval values 110 and 112 are set to the value which defines the minimum interval between first wirings 101a to 101f and second wirings 102a to 102i and first dummy via pattern 121, respectively. That is, a region indicated by enlarged patterns 109a, 109b, and 111 which are outputted in step S301 corresponds to a region where arrangement of first dummy via pattern 121 is prohibited in the vicinity of first wirings 101a to 101f and second wirings 102a to 102i.

Figure 10:
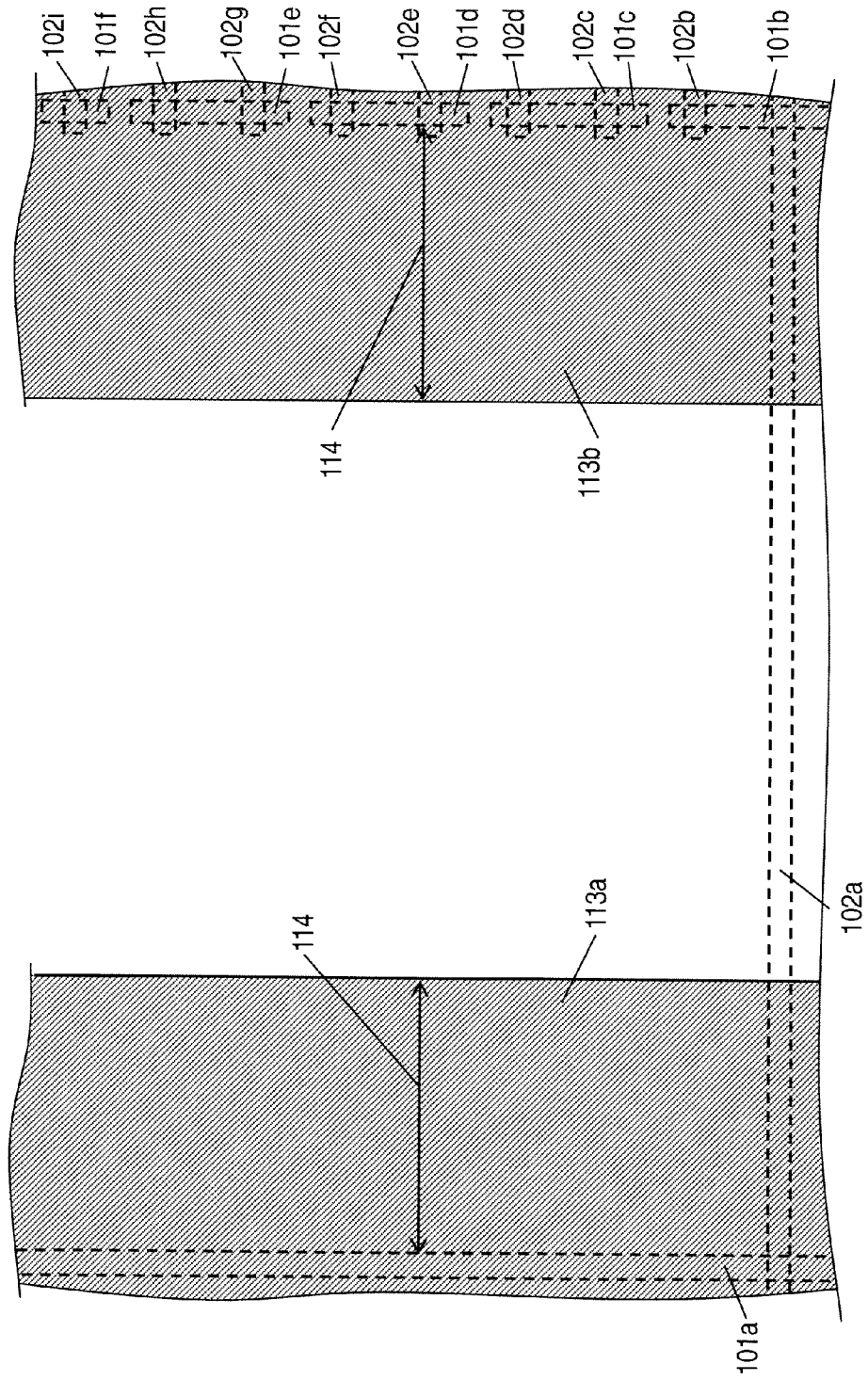
FIG. 10 is a diagram illustrating a procedure of the wiring auxiliary pattern generating method according to the first exemplary embodiment.
Figure 11:
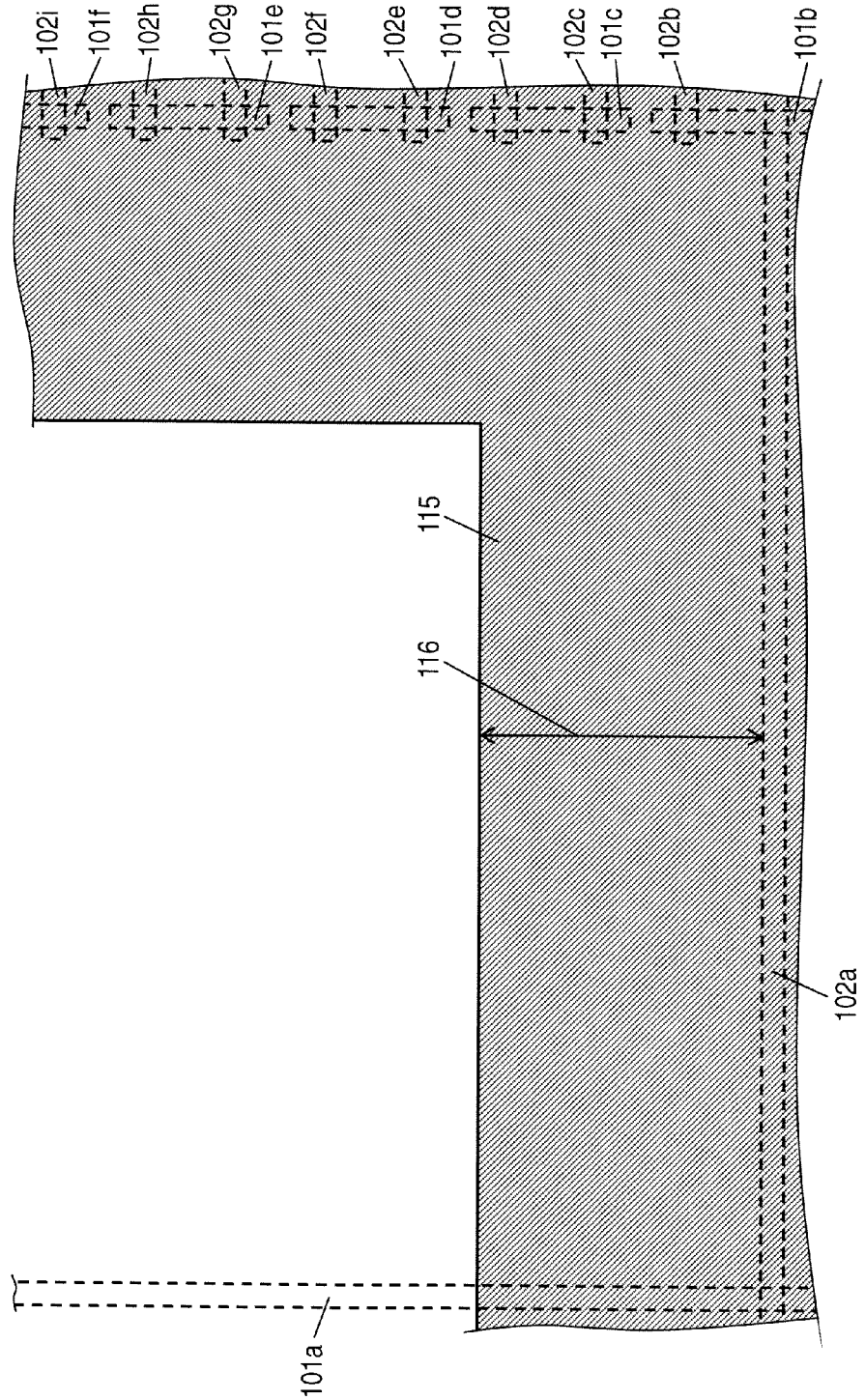
FIG. 11 is a diagram illustrating a procedure of the wiring auxiliary pattern generating method according to the first exemplary embodiment.

Step S302 corresponds to a second wiring enlargement step using the value which defines the upper limit distance indicating the vicinity. Specifically, as illustrated in FIG. 10, an enlargement process is performed for first wirings 101a to 101f extracted in step S201 using fifth interval value 114 to output enlarged patterns 113a and 113b. Similarly, as illustrated in FIG. 11, an enlargement process is performed for second wirings 102a to 102i extracted in step S201 using sixth interval value 116 to output enlarged pattern 115.

Here, fifth and sixth interval values 114 and 116 are set to the value which defines the upper limit distance indicating the vicinity of first wirings 101a to 101f and second wirings 102a to 102i. Thus, a region indicated by enlarged patterns 113a, 113b, and 115 which are outputted in step S302 corresponds to a region indicating the vicinity of first wirings 101a to 101f and second wirings 102a to 102i.

Figure 12:
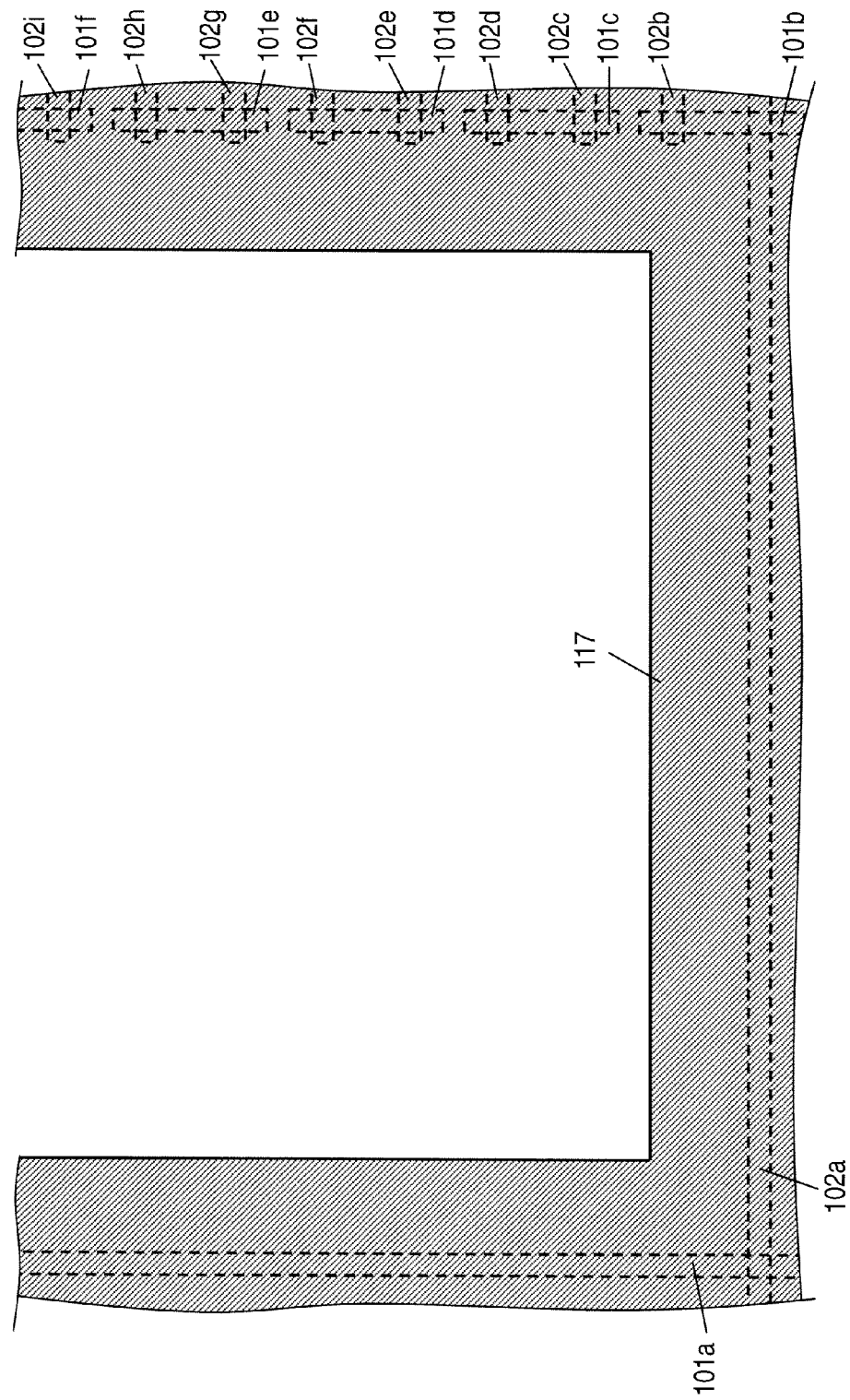
FIG. 12 is a diagram illustrating a procedure of the wiring auxiliary pattern generating method according to the first exemplary embodiment.
Figure 13:
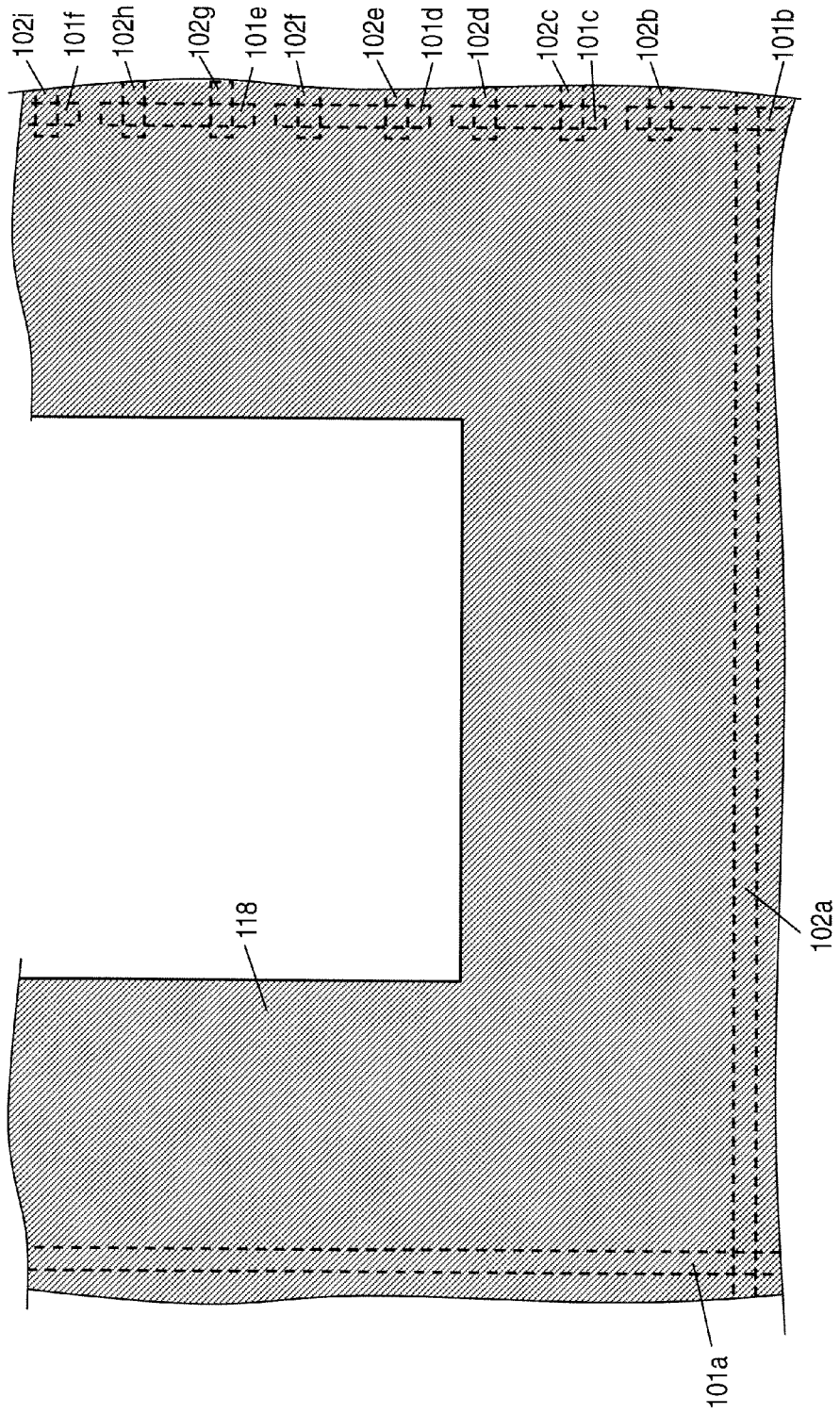
FIG. 13 is a diagram illustrating a procedure of the wiring auxiliary pattern generating method according to the first exemplary embodiment.
Figure 14:
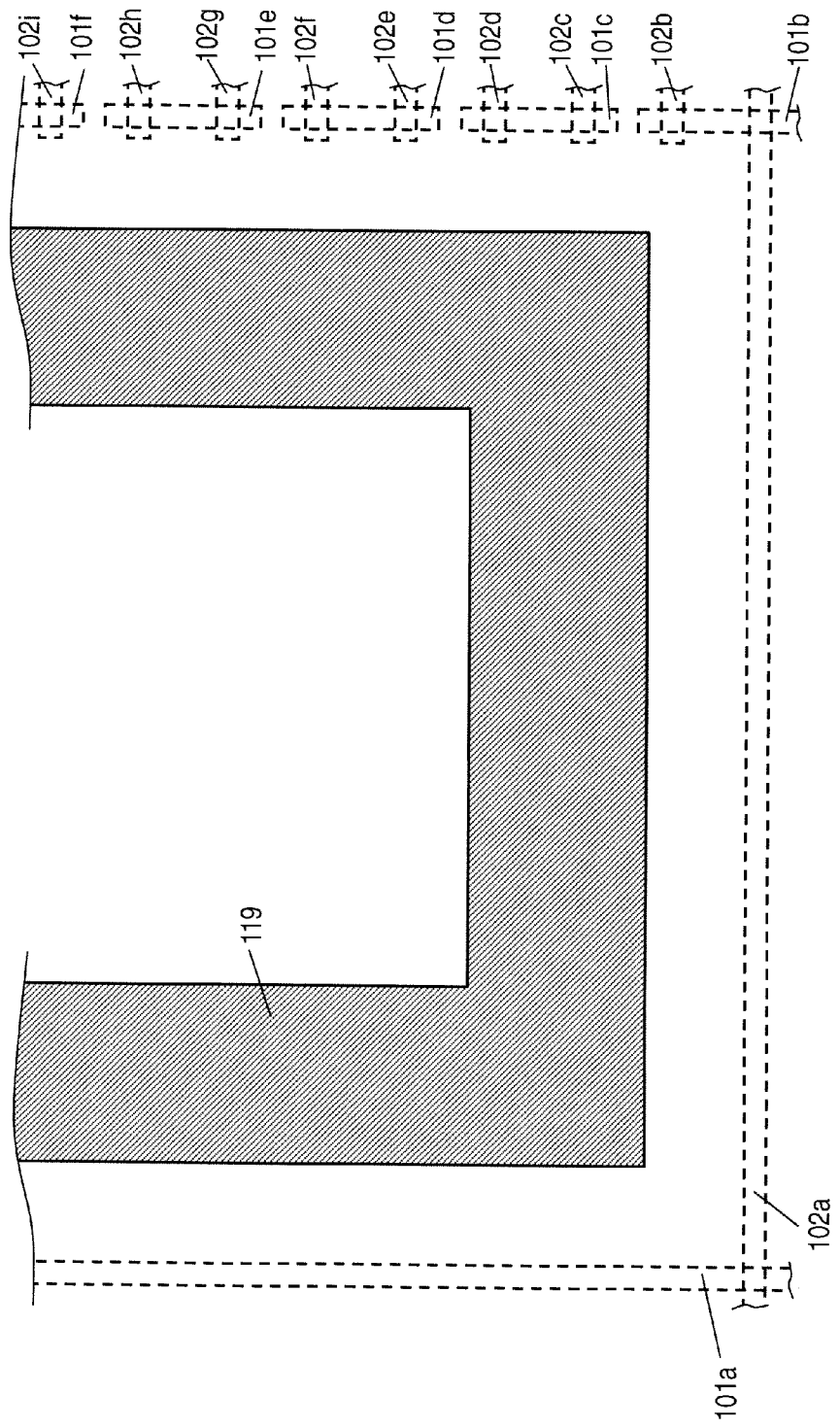
FIG. 14 is a diagram illustrating a procedure of the wiring auxiliary pattern generating method according to the first exemplary embodiment.

In step S303, the region indicated by enlarged patterns 109a, 109b, and 111 which are outputted in step S301 is removed from the region indicated by enlarged patterns 113a, 113b, and 115 which are outputted in step 302, and then the result is outputted. Specifically, as illustrated in FIG. 12, enlarged patterns 109a, 109b, and 111 which are extracted in step S301 are composed to generate composite pattern 117. Further, as illustrated in FIG. 13, enlarged patterns 113a, 113b, and 115 are composed to generate composite pattern 118. Further, as illustrated in FIG. 14, an overlap portion of composite pattern 117 and generated composite pattern 118 is removed from generated composite pattern 118. Region 119 which remains after removal represents a region where the dummy vias can be arranged in the vicinity of first wirings 101a to 101f and second wirings 102a to 102i, and is outputted as first dummy via pattern arrangeable region 119.

In the present exemplary embodiment, an example in which an overlap region of both a part of overlap region 108 and a part of the region indicated by enlarged patterns 109a, 109b, and 111 is present is described, but in a case where the overlap region of overlap region 108 and the region indicated by enlarged patterns 109a, 109b, and 111 is not present, the region where arrangement of first dummy via pattern 121 is prohibited in the vicinity of the wirings is not present. That is, at this time, the region indicated by composite pattern 118 becomes the first dummy via pattern arrangeable region.

Figure 15:
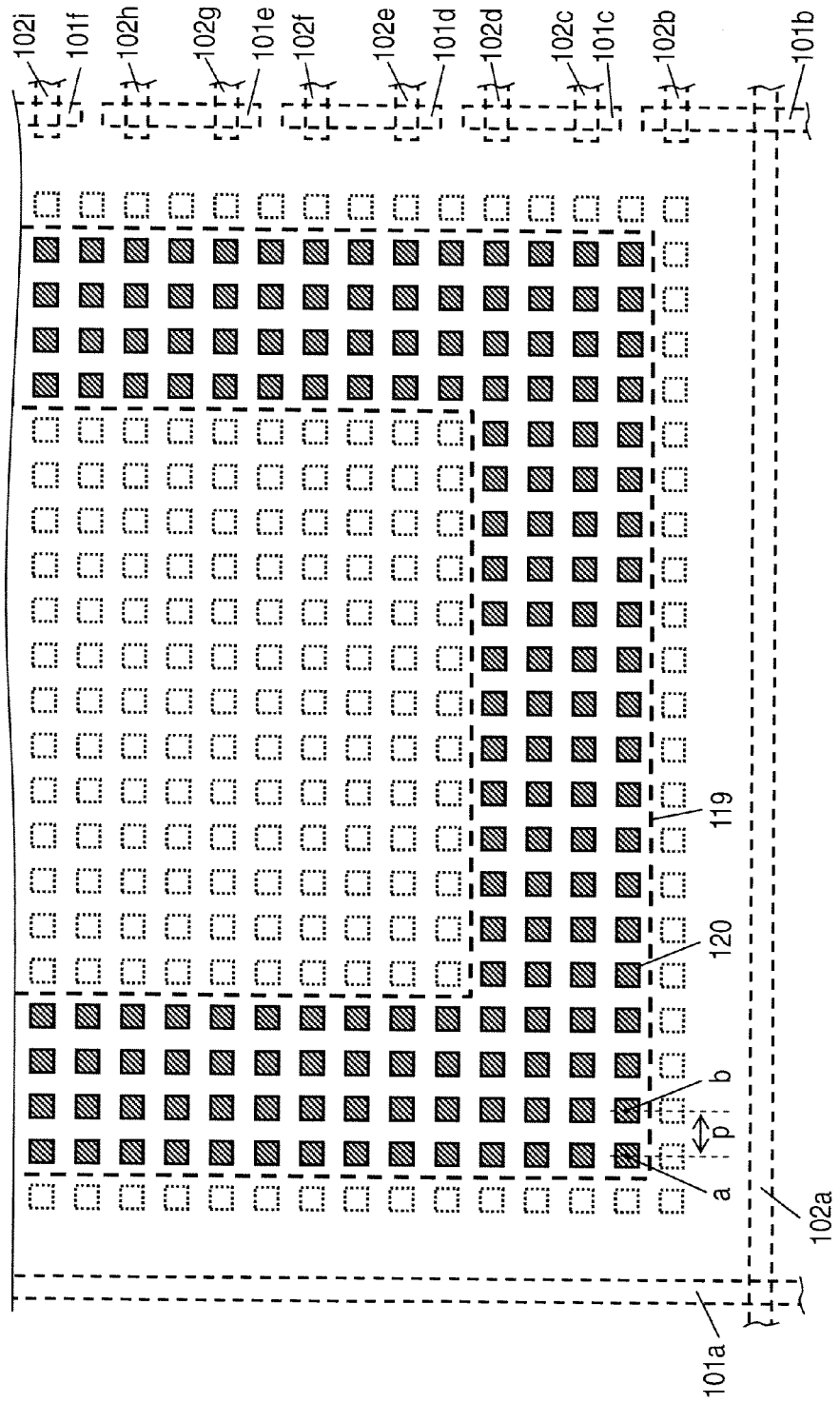
FIG. 15 is a diagram illustrating a procedure of the wiring auxiliary pattern generating method according to the first exemplary embodiment.
Figure 16:
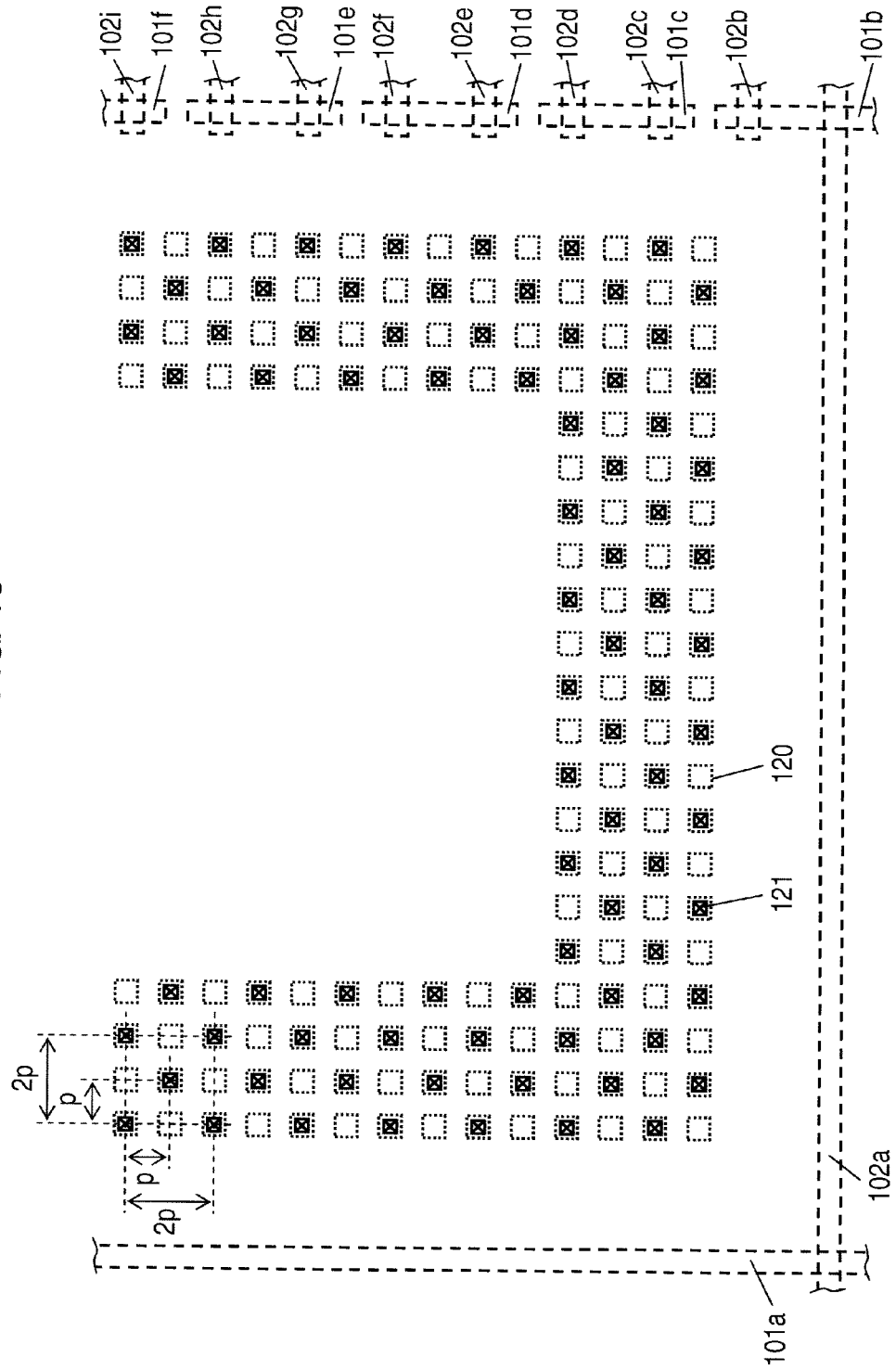
FIG. 16 is a diagram illustrating a procedure of the wiring auxiliary pattern generating method according to the first exemplary embodiment.

Next, in step S205, as illustrated in FIG. 15, overlap region 120 of both overlap region 108 outputted in step S203 and first dummy via pattern arrangeable region 119 outputted in step S204 is extracted. Overlap region 120 becomes a region which indicates in detail the region where the dummy vias can be arranged in the vicinity of first wirings 101a to 101f and second wirings 102a to 102i. Further, as illustrated in FIG. 16, first dummy via pattern 121 is arranged for output with respect to overlap region 120, based on a predetermined first dummy via pattern generation specification.

Here, it is preferable that the predetermined first dummy via pattern generation (arrangement) specification be a generation (arrangement) specification which defines the arrangement pitch of the dummy vias so that the density of the dummy vias is the highest in a range in which the design standard for each semiconductor process is complied with. For example, in FIG. 16, an example is illustrated in which when the distance between the centers (between a and b) of two adjacent overlap regions 120 in FIG. 15 is p, first dummy via pattern 121 is arranged in respective row and column directions with a uniform pitch of 2×p, and is arranged at the center of each lattice formed by four adjacent dummy vias. Specifically, the centers of the lattices refer to overlap regions 120 which are positioned at intersections of a plurality of virtual lines passing through central points of two dummy vias which are adjacent to each other in the row direction and respectively extending in the column direction and a plurality of virtual lines passing through central points of two dummy vias which are adjacent to each other in the column direction and respectively extending in the row direction, in the dummy vias which are arranged with a uniform pitch of 2×p in the respective row and column directions.

Figure 17:
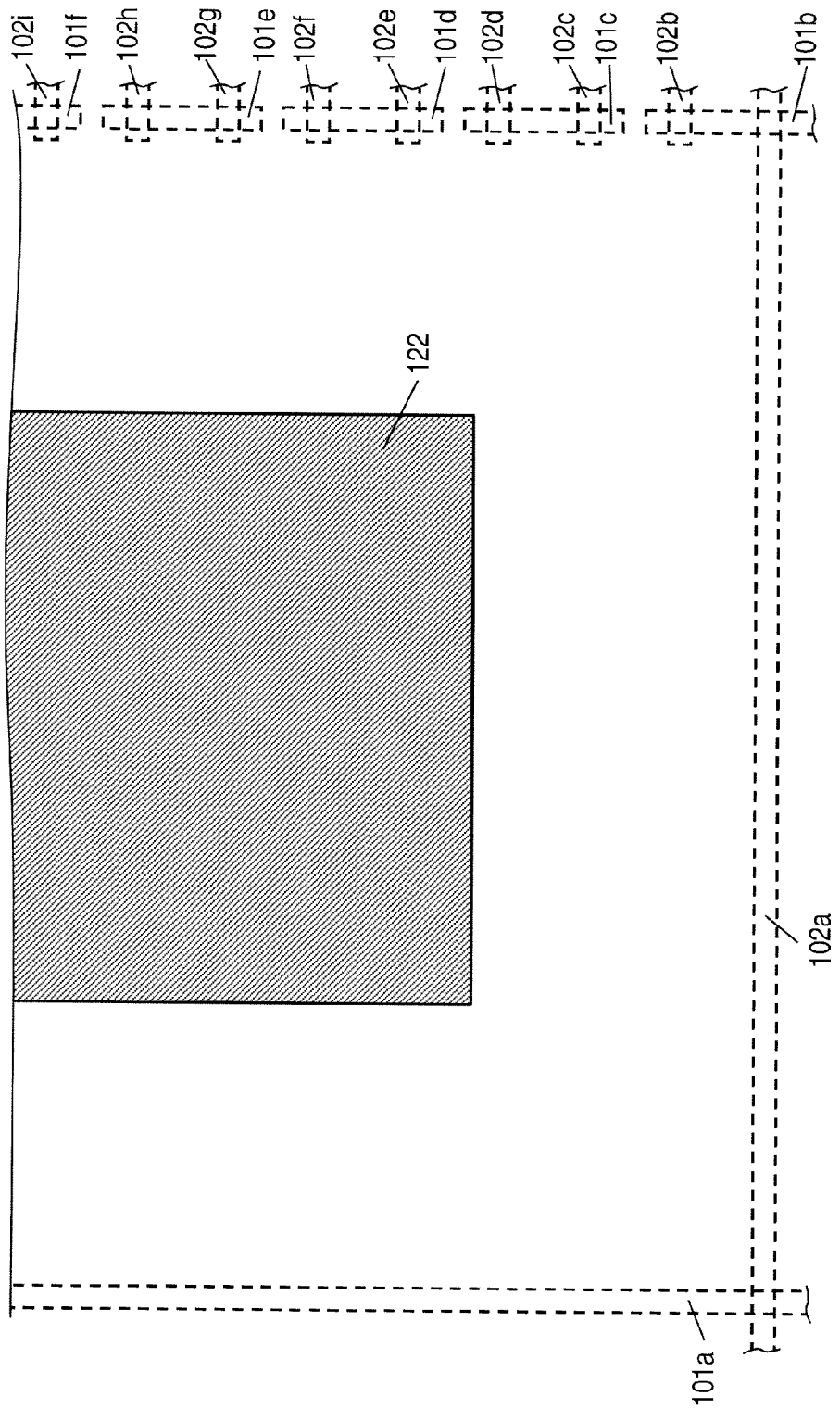
FIG. 17 is a diagram illustrating a procedure of the wiring auxiliary pattern generating method according to the first exemplary embodiment.

Next, in step S206, a distant region from first wirings 101a to 101f and second wirings 102a to 102i with reference to first dummy via pattern arrangeable region 119 is extracted. Specifically, as illustrated in FIG. 17, enlarged patterns 113a, 113b, and 115 which are outputted in step S302 which forms step S204 are composed, and a figure inversion process is performed for composite pattern 118 to generate region 122 where patterns 113a, 113b, and 115 which are outputted in step S302 are not present, for output.

Here, fifth and sixth interval values 114 and 116 which are used in step S302 correspond to the value which defines the upper limit distance indicating the vicinity of first wirings 101a to 101f and second wirings 102a to 102i. That is, region 122 which is a result obtained by performing the figure inversion process indicates a region where the dummy vias can be arranged in the distant region from first wirings 101a to 101f and the second wirings 102a to 102i with reference to first dummy via pattern arrangeable region 119. In step S206, the region is outputted as second dummy via pattern arrangeable region 122.

Figure 18:
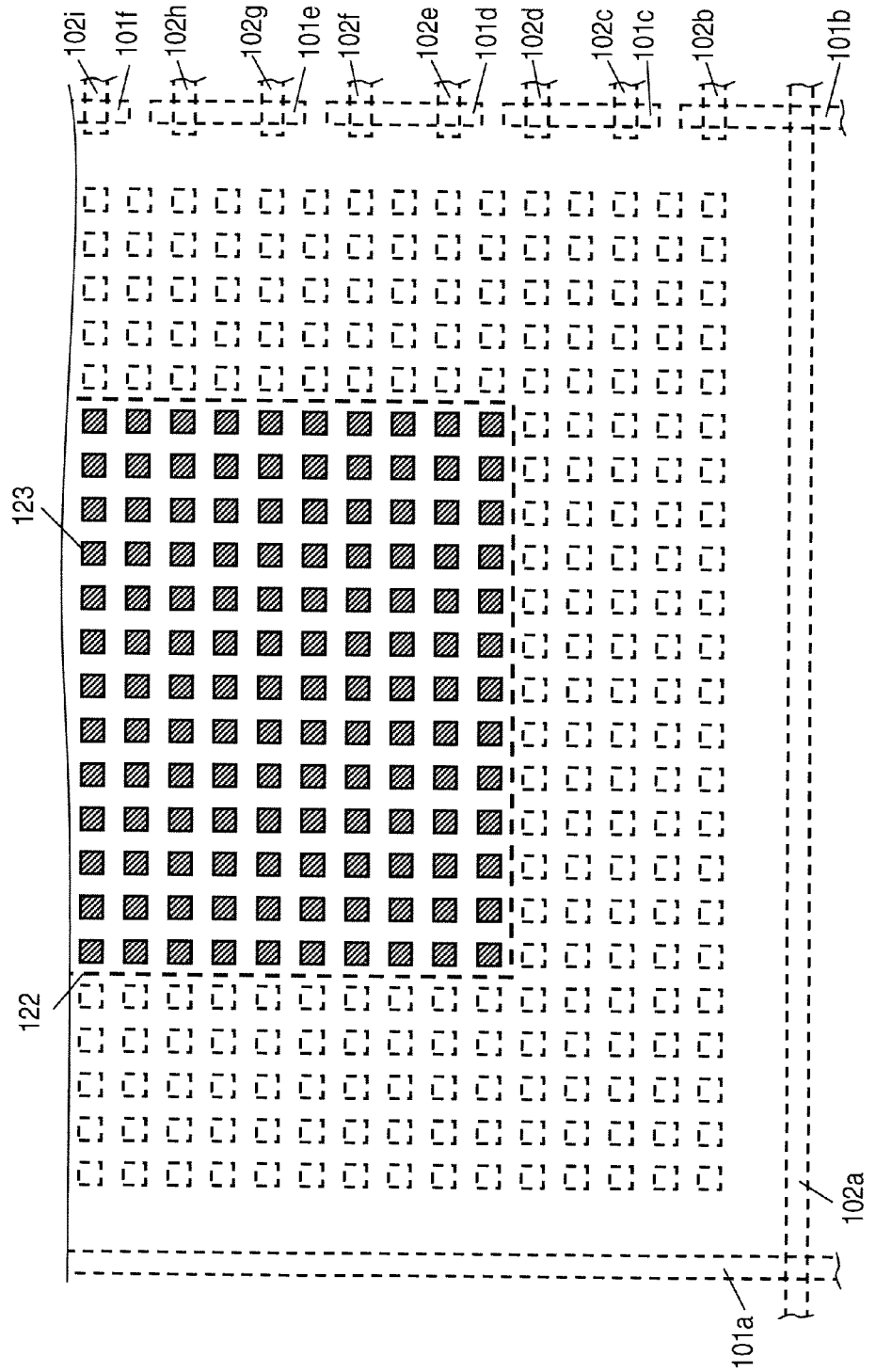
FIG. 18 is a diagram illustrating a procedure of the wiring auxiliary pattern generating method according to the first exemplary embodiment.
Figure 19:
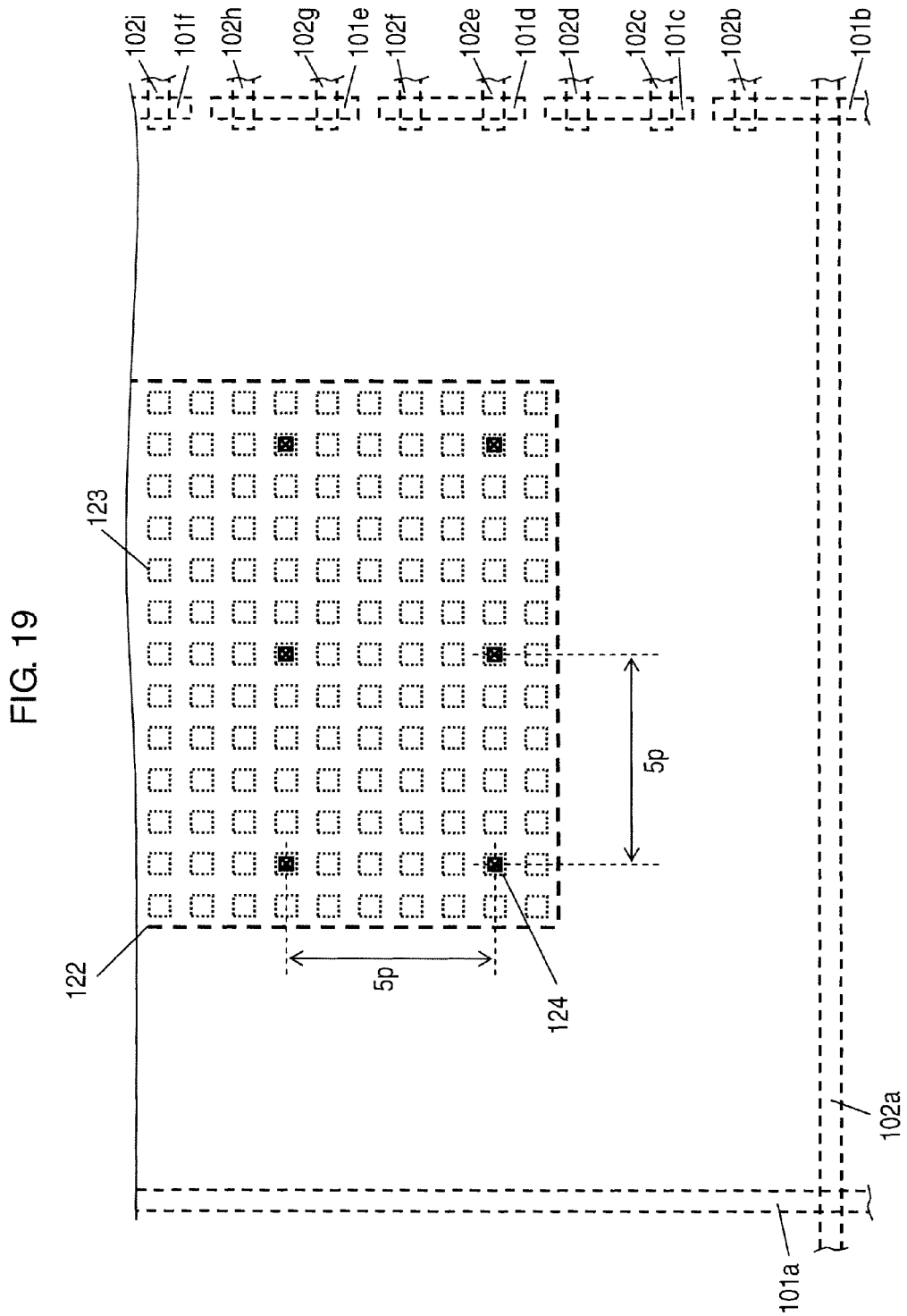
FIG. 19 is a diagram illustrating a procedure of the wiring auxiliary pattern generating method according to the first exemplary embodiment.

Next, in step S207, as illustrated in FIG. 18, overlap region 123 of both overlap region 108 outputted in step S203 and second dummy via arrangeable region 122 outputted in step S206 is extracted. Overlap region 123 becomes a region which indicates in detail the region where the dummy vias can be arranged in the distant region from first wirings 101a to 101f and second wirings 102a to 102i with reference to first dummy via pattern arrangeable region 119. Further, as illustrated in FIG. 19, second dummy via pattern 124 is arranged for output with respect to overlap region 123 based on a predetermined second dummy via pattern generation specification.

Here, it is preferable that the predetermined second dummy via pattern generation (arrangement) specification be a generation (arrangement) specification which defines a minimum arrangement pitch of the dummy vias which is necessary to achieve a lower limit value of the density of the dummy vias regulated by the design standard for each semiconductor process. For example, in FIG. 19, an example is illustrated in which the uniform pitch of 2×p in FIG. 16 is replaced with a uniform pitch of 5×p for arrangement in overlap region 123. Here, the arrangement of the dummy via at the center of each lattice formed by four adjacent dummy vias, as performed in FIG. 16, is not performed. That is, the distance between the respective dummy vias of first dummy via pattern 121 which is arranged in the vicinity of first wiring 101a and second wiring 101b, illustrated in FIG. 16, is shorter than the distance between the respective dummy vias of second dummy via pattern 124 which is arranged in a distant region from second wiring 101b with reference to the first dummy via pattern, illustrated in FIG. 19.

Figure 20:
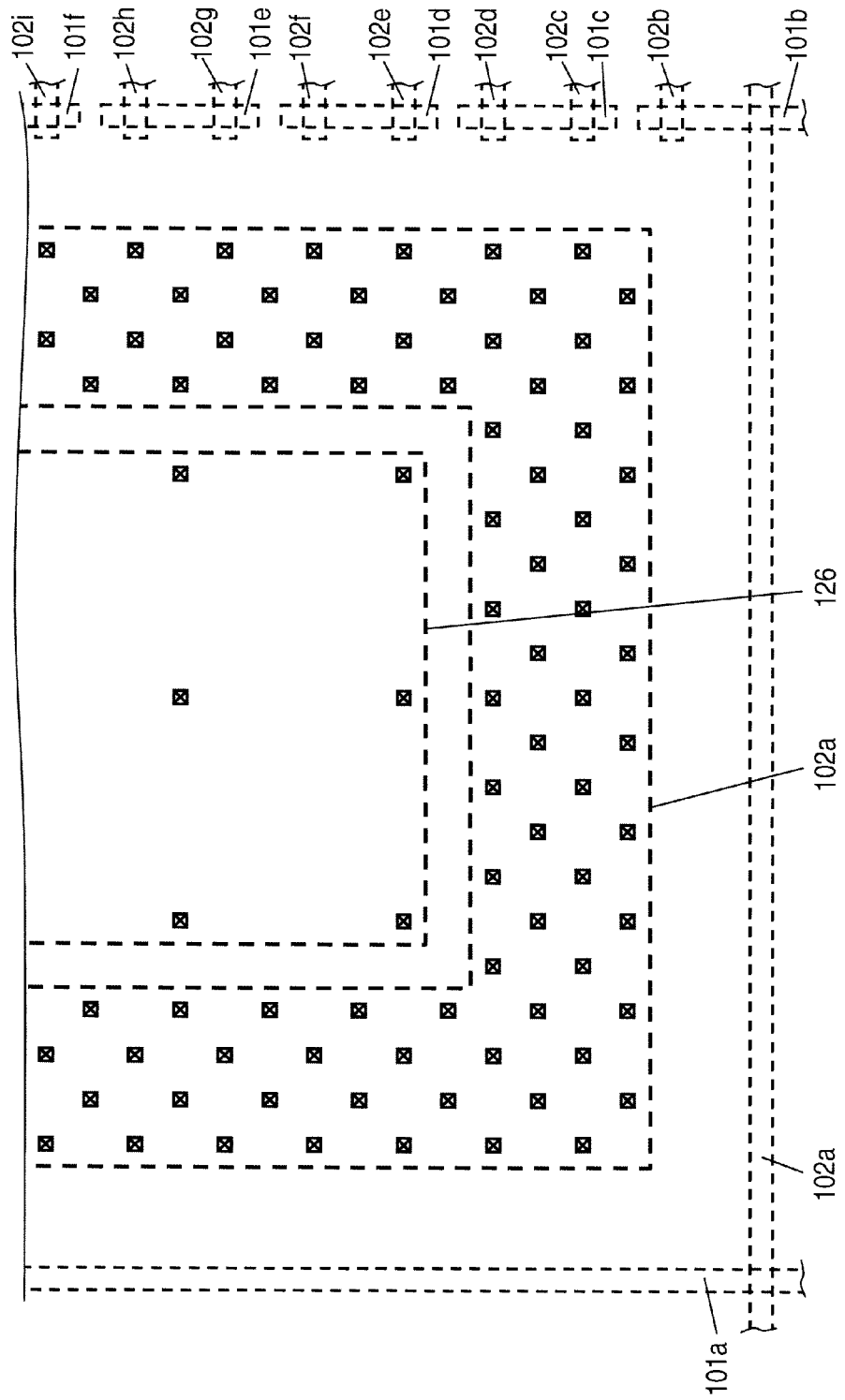
FIG. 20 is a diagram illustrating a procedure of the wiring auxiliary pattern generating method according to the first exemplary embodiment.

FIG. 20 illustrates a state in which first and second dummy via patterns 121 and 124 are arranged in first and second dummy via pattern arrangement regions 125 and 126 after the processes of steps S201 to S207 end. In FIGS. 14, 15, and 20, first dummy via pattern arrangeable region 119 and first dummy via pattern arrangement region 125 indicate the same region. Similarly, in FIGS. 17 to 19 and FIG. 20, second dummy via pattern arrangeable region 122 and second dummy via pattern arrangement region 126 indicate the same region.

By performing the above-mentioned steps S201 to S207, as illustrated in FIGS. 1 and 20, it is possible to arrange first dummy via pattern 121 in first dummy via pattern arrangement region 125 which is the region in the vicinity of first wirings 101a to 101f and second wirings 102a to 102i in high density. Further, simultaneously, it is possible to arrange second dummy via pattern 124 in second dummy via pattern arrangement region 126 which is the distant region from first wirings 101a to 101f and second wirings 102a to 102i with reference to first dummy via pattern arrangement region 125 in low density.

As described above, in the semiconductor device (semiconductor integrated circuit) designed by the method of the present exemplary embodiment, it is possible to arrange the high density dummy via pattern in the vicinity region of the first and second wirings, and to arrange the low density dummy via pattern in the distant region with reference to the vicinity region of the first and second wirings. Thus, it is possible to comply with the design standard regulated for each semiconductor process without surplus arrangement of the dummy vias. That is, it is possible to suppress expansion of the file size of the layout CAD data which represents the dummy vias while complying with the design standard regulated for each semiconductor process.

As the arrangement specification of the dummy via pattern in steps S205 and S207, an arrangement example of first dummy via pattern 121 and second dummy via pattern 124 has been described with respect to FIGS. 16 and 19, but various modifications of the dummy via arrangement specification may be made to achieve the target density of the dummy vias. For example, the pitch of the respective dummy vias may be modified, or for example, modifications such as dummy via patterns 128 to 130 illustrated in FIGS. 21A, 21B, and 21C are possible.

Figures 21A, 21B, 21C:
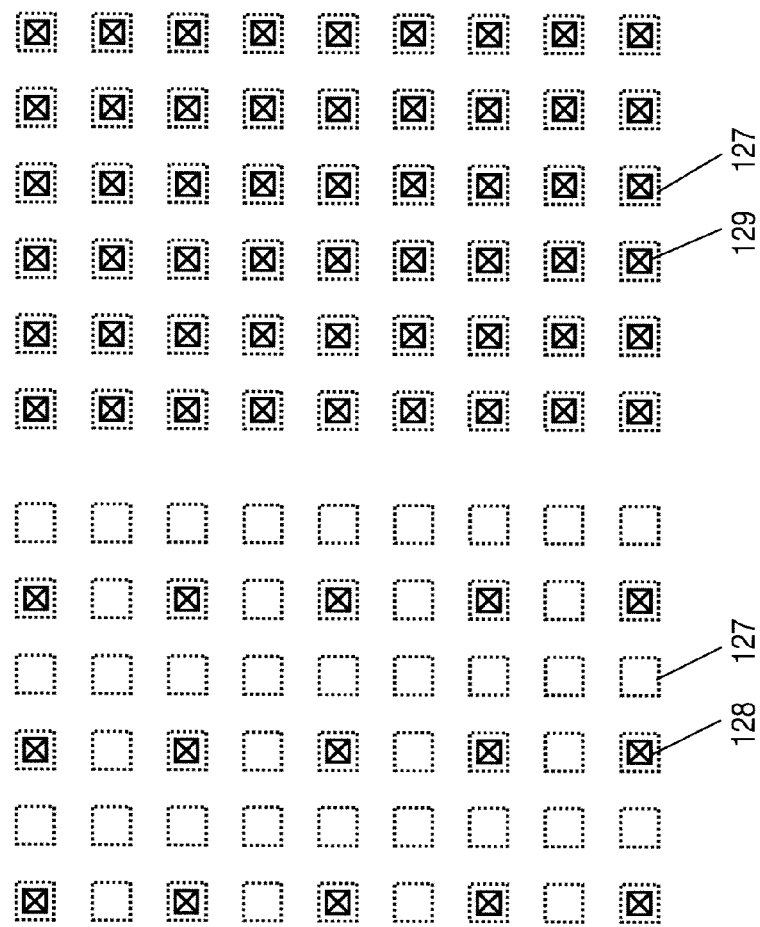
FIG. 21A is a diagram illustrating a modification example of a dummy via pattern arrangement specification.
FIG. 21B is a diagram illustrating a modification example of a dummy via pattern arrangement specification.
FIG. 21C is diagram illustrating a modification example of a dummy via pattern arrangement specification.

FIGS. 21A, 21B, and 21C illustrates other examples of the dummy via pattern arrangement specification in overlap region 127 of first dummy wiring pattern 104 and second dummy wiring pattern 106. Here, FIG. 21A shows an example in which as dummy via pattern 128, the dummy vias are arranged with a uniform pitch of 2×p in a similar way to FIG. 16 but the dummy via is not arranged at the center of each lattice formed by four adjacent dummy vias. Further, FIG. 21B shows an example in which as dummy via pattern 129, the dummy vias are arranged in all overlap regions of overlap region 127. Further, FIG. 21C shows an example in which as dummy via pattern 130, the dummy vias are arranged in respective overlap regions 127 which are present in the right upper direction from one overlap region 127 which is present in the leftmost lower part and are arranged with a uniform pitch of 3 pitches in the respective upper and right directions from each arranged dummy via.

Further, in description of steps S205 and S207, in overlap region 108 of first dummy wiring pattern 104 and second dummy wiring pattern 106, one dummy via is arranged in one overlap region, but the dummy via arrangement specification is not limited thereto. For example, a plurality of dummy vias may be arranged in one overlap region, in a range where the design standard regulated for each semiconductor process is complied with.

Further, as the wiring width and the wiring interval of first dummy wiring pattern 104 and second dummy wiring pattern 106, in a similar way to first wirings 101a to 101f and second wirings 102a to 102i, the minimum size (wiring width) and the minimum wiring interval regulated by the design standard or the like for each semiconductor process are used, but the present invention is not limited thereto, modifications to various sizes (wiring widths and wiring intervals) may be performed in the range where the design standard for each semiconductor process is complied with.

Figure 22:
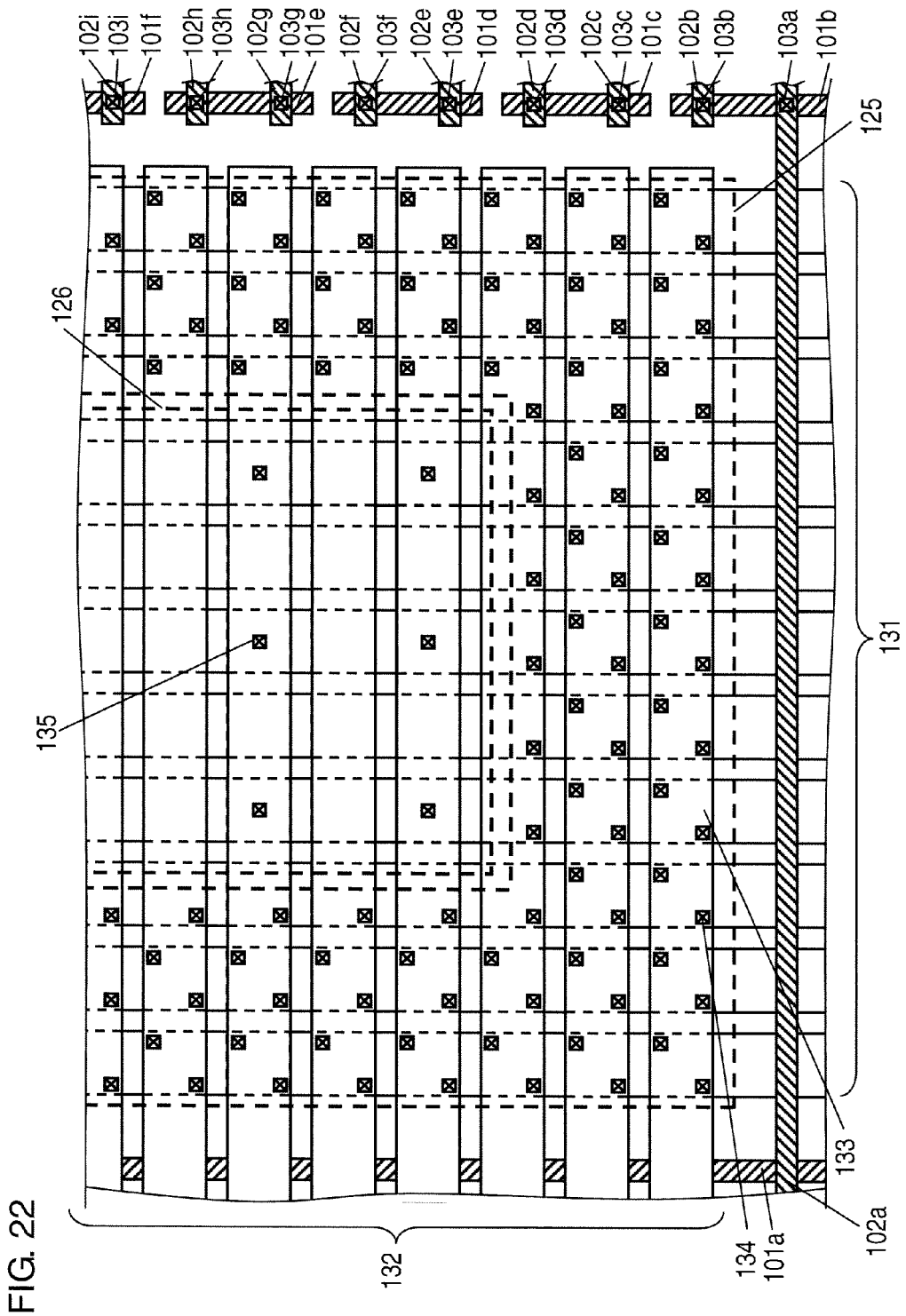
FIG. 22 is a plan view illustrating another example of the wiring layout in a case where the semiconductor device according to the first exemplary embodiment is seen from above.

FIG. 22 is another example of a plan view illustrating the wiring layout in a case where the semiconductor device according to the first exemplary embodiment is seen from above, which is an example in which a plurality of dummy vias are arranged in one overlap region.

In FIG. 22, first dummy wiring pattern 131 and second dummy wiring pattern 132 have a wiring width of three times the wiring width of first wirings 101a to 101f and second wirings 102a to 102i. That is, in first and second dummy wiring patterns 131 and 132, the wiring pitch obtained by adding the wiring width and the wiring interval corresponds to four times the wiring pitch of first wirings 101a to 101f and second wirings 102a to 102i. Further, in overlap region 133 of first dummy wiring pattern 131 and second dummy wiring pattern 132, in first dummy via pattern arrangement region 125 which is adjacent to first wirings 101a to 101f and second wirings 102a to 102i, two dummy vias are arranged in one overlap region 133 to form first dummy via pattern 134. Further, in second dummy via pattern arrangement region 126 which is distant from first wirings 101a to 101f and second wirings 102a to 102i with reference to first dummy via pattern arrangement region 125, one dummy via is disposed in one overlap region 133 to form second dummy via pattern 135.

In the present exemplary embodiment, in first and second dummy wiring patterns 131 and 132, the wiring pitch obtained by adding the wiring width and the wiring interval is four times the wiring pitch of first wirings 101a to 101f and second wirings 102a to 102i, but the wiring pitch is not limited to the four times. It is preferable that the wiring pitch be an integral multiple.

Further, in the present exemplary embodiment, the extension direction of first dummy wiring pattern 104 is the same as the priority wiring direction (column direction) of the first wiring layer, and the extension direction of second dummy wiring pattern 106 is the same as the priority wiring direction (row direction) of the second wiring layer, but the extension directions are not limited thereto. For example, the extension direction of first dummy wiring pattern 104 may be orthogonal to the priority wiring direction (column direction) of the first wiring layer, and the extension direction of second dummy wiring pattern 106 may be orthogonal to the priority wiring direction (row direction) of the second wiring layer.

Further, the example in which first dummy wiring pattern 104 and second dummy wiring pattern 106 are orthogonal to each other has been described, but the present invention is not limited thereto. However, it is preferable that first dummy wiring pattern 104 and second dummy wiring pattern 106 be orthogonal to each other.

Second Exemplary Embodiment

Figure 23:
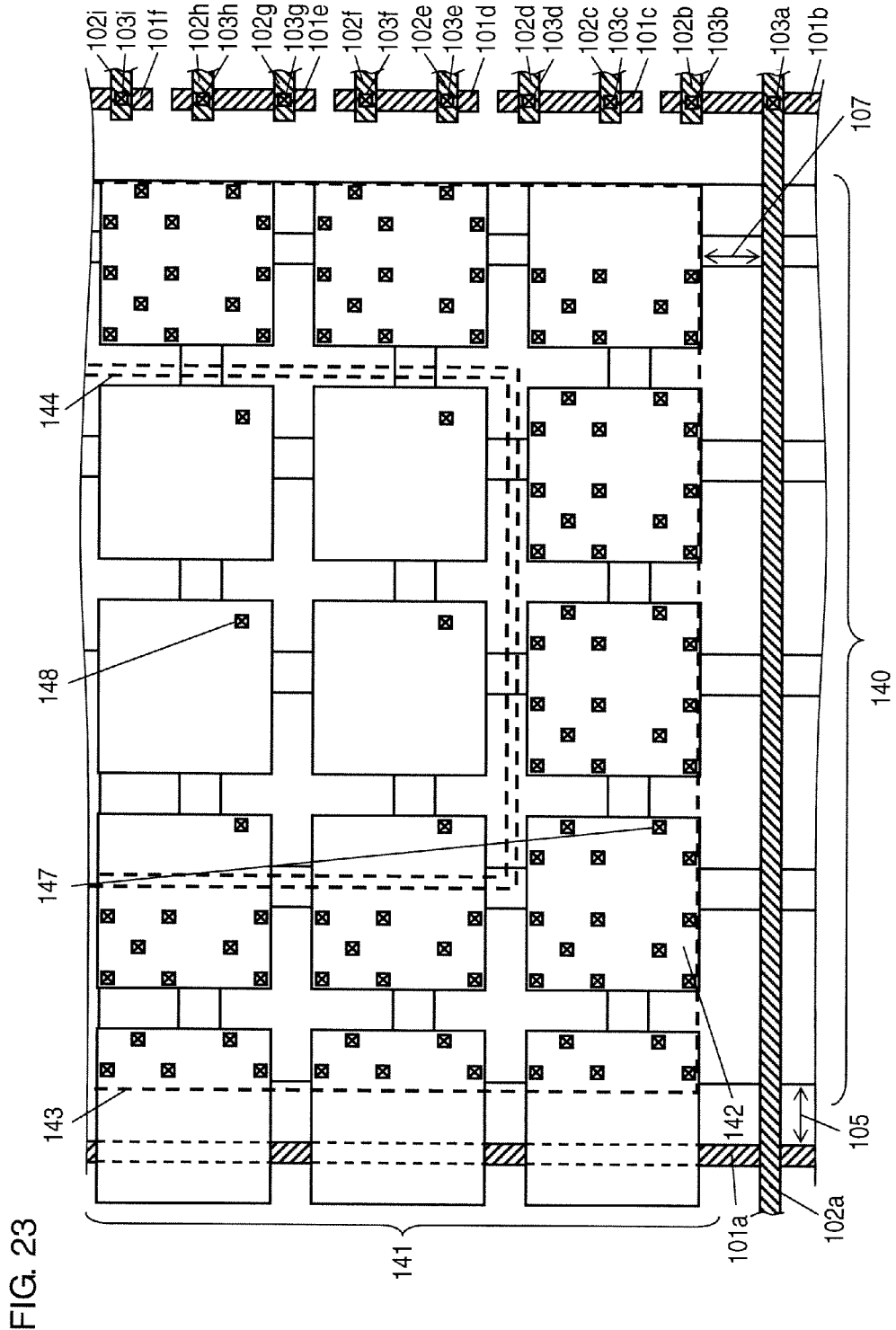
FIG. 23 is a plan view illustrating a wiring layout in a case where a semiconductor device according to a second exemplary embodiment is seen from above.
Figure 24:
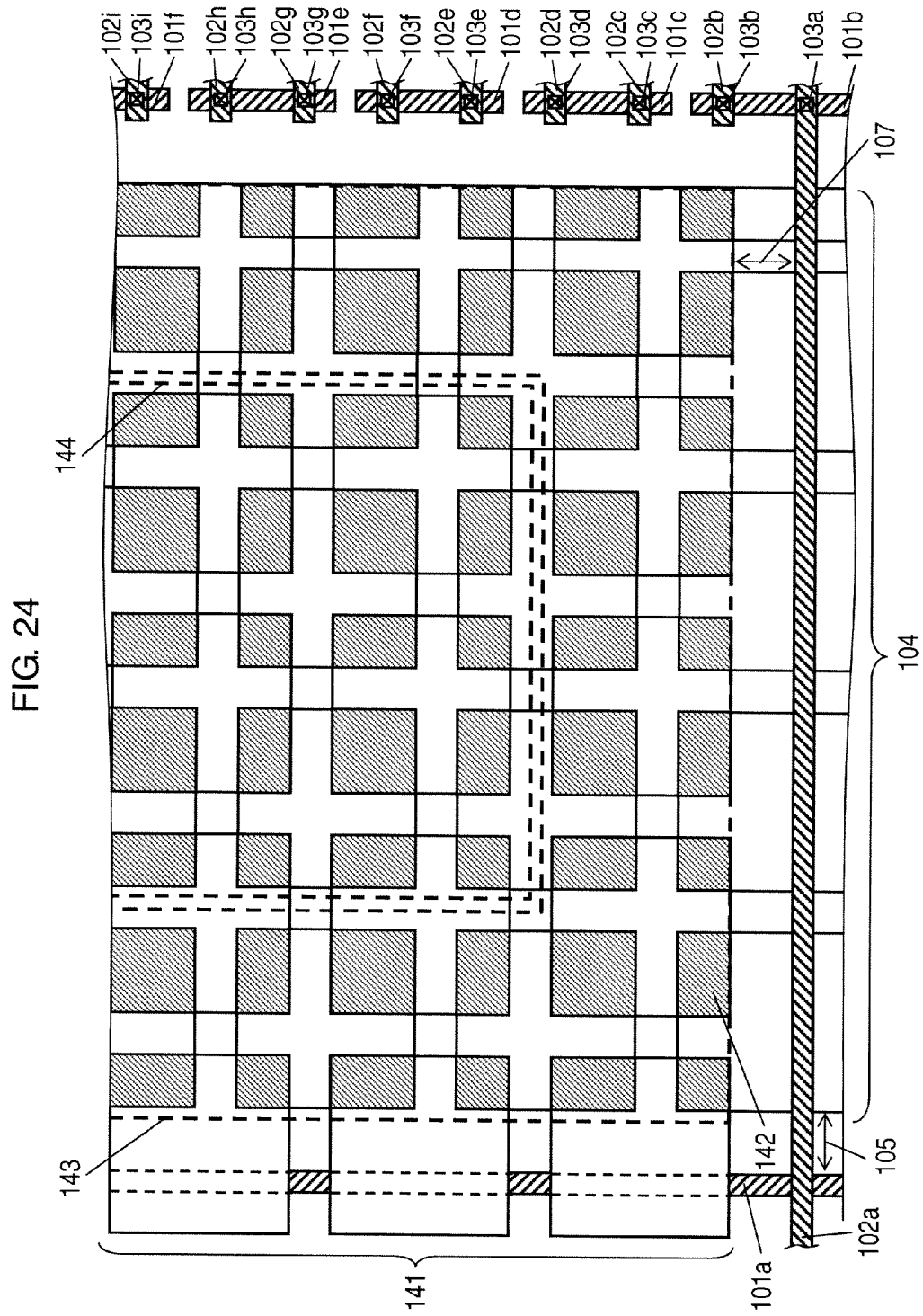
FIG. 24 is a diagram illustrating a procedure of a wiring auxiliary pattern generating method according to the second exemplary embodiment.
Figure 25:
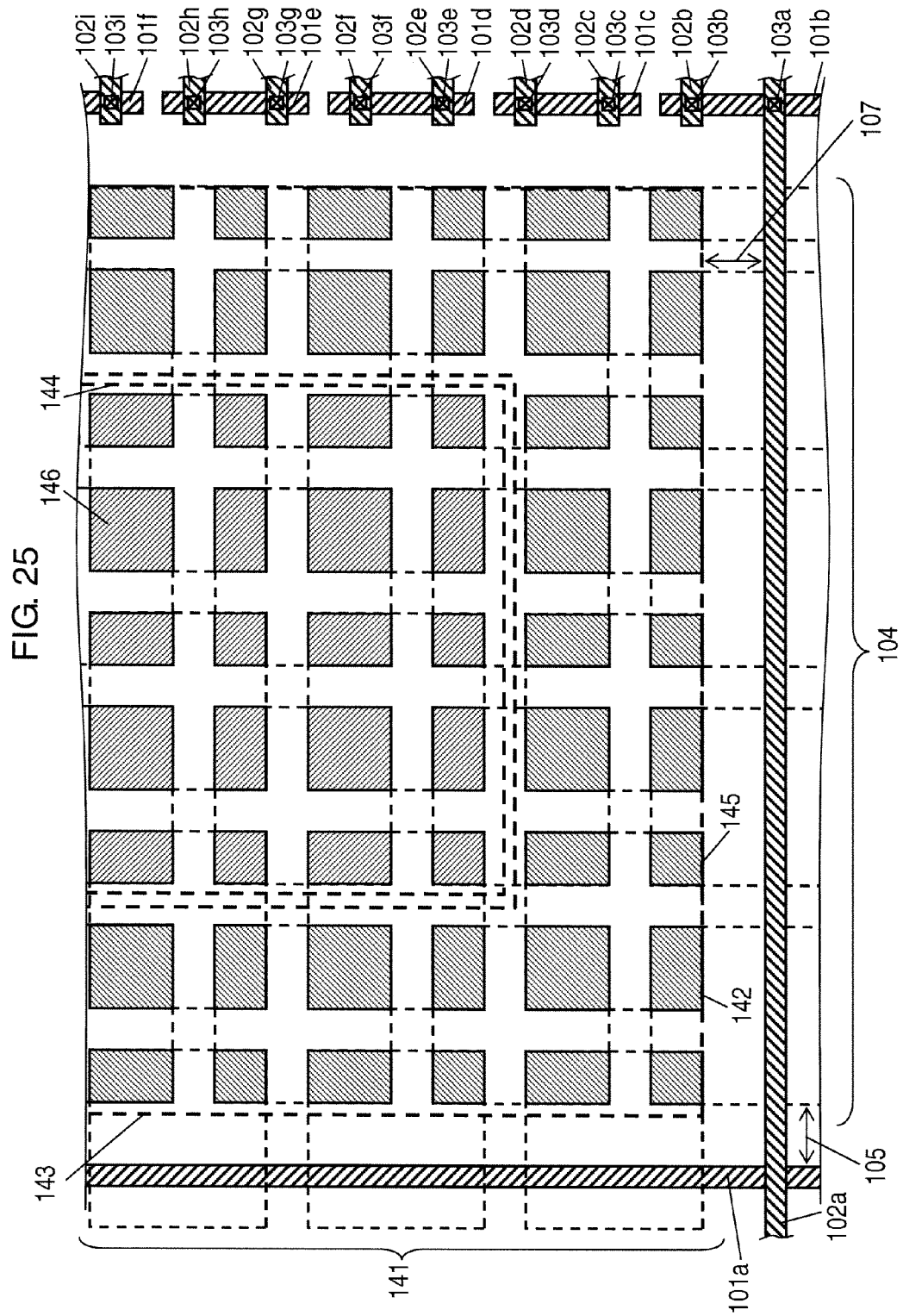
FIG. 25 is a diagram illustrating a procedure of a wiring auxiliary pattern generating method according to the second exemplary embodiment.

FIG. 23 is a plan view illustrating a wiring layout in a case where a semiconductor device according to a second exemplary embodiment is seen from above. In FIG. 23, same reference numerals are given to common components which are the same as those in FIG. 1, and detailed description thereof will be omitted. Further, FIGS. 24 and 25 are diagrams illustrating a generating process of a wiring auxiliary pattern according to the second exemplary embodiment.

In the wiring layout in FIG. 23, it is different from FIG. 1 in that first dummy wiring pattern 140 formed in gap portion of first wirings 101a to 101f in a first wiring layer and second dummy wiring pattern 141 formed in a gap portion of second wirings 102a to 102i in a second wiring layer have a rectangular dummy wiring pattern arranged in a matrix form with a uniform pitch.

First dummy via pattern 147 is arranged in overlap region 142 in first dummy via pattern arrangement region 143 which is a region in the vicinity of first wirings 101a to 101f and second wirings 102a to 102i, and is formed through an interlayer insulation film between the first wiring layer and the second wiring layer and connects first dummy wiring pattern 140 to second dummy wiring pattern 141.

Second dummy via pattern 148 is arranged in overlap region 142 in second dummy via pattern arrangement region 144 which is a distant region, with reference to first dummy via pattern arrangement region 143, from first wirings 101a to 101f and second wirings 102a to 102i, and is formed through the interlayer insulation film between the first wiring layer and the second wiring layer and connects first dummy wiring pattern 140 to second dummy wiring pattern 141.

A method of generating a wiring auxiliary pattern according to a second exemplary embodiment will be described with reference to FIGS. 23 to 25 and the drawings used for description of the first exemplary embodiment.

Hereinafter, respective steps will be described with reference to FIG. 2, in a similar way to the first exemplary embodiment.

Firstly, in step S201, for example, layout CAD data which includes wiring layout information of a semiconductor device (semiconductor integrated circuit) is inputted into a computer in which an analysis tool is installed, and a wiring pattern of a corresponding region is extracted. Specifically, as illustrated in FIG. 4, first wirings 101a to 101f and second wirings 102a to 102i are extracted.

Next, in step S202, as illustrated in FIG. 23, in a gap portion where first wirings 101a to 101f which are extracted in step S201 are not formed, first rectangular dummy wiring pattern 140 is generated in a matrix form with a uniform pitch at an interval of first interval value 105 from first wirings 101a to 101f. Similarly, in a gap portion where second wirings 102a to 102i which are extracted in step S201 are not formed, second rectangular dummy wiring pattern 141 is generated in a matrix form with a uniform pitch at an interval of second interval value 107 from second wirings 102a to 102i. In the present exemplary embodiment, first and second dummy wiring patterns 140 and 141 have different origin points which are arranged with a uniform pitch, respectively. Then, as illustrated in FIG. 23, first dummy wiring pattern 140 and second dummy wiring pattern 141 have a partially overlapped region.

Here, in first dummy wiring pattern 140 and second dummy wiring pattern 141, only a region which does not satisfy the rectangular size arranged with a uniform pitch may remain in the respective boundary portions of the gap portion having the interval of predetermined first value 105 where first wirings 101a to 101f are not formed and the gap portion having the interval of predetermined second value 107 where second wirings 102a to 102i are not formed. At this time, it is preferable to arrange a part of the rectangular wirings as a cutoff. Further, the shape of the dummy wiring which remains as the cutoff, as described above, may not satisfy a minimum size, a minimum area or the like which is regulated by a design standard or the like for each semiconductor process. At this time, it is preferable to remove the rectangular dummy wiring which remains by the cutoff.

Next, in step S203, overlap region 142 of first dummy wiring pattern 140 and second dummy wiring pattern 141 outputted in step S202 is extracted, as illustrated in FIG. 24. Overlap region 142 is a region where first dummy wiring pattern 140 and second dummy wiring pattern 141 are present together, and thus corresponds to a region where first and second dummy via patterns 147 and 148 can be arranged.

Next, in step S204, first dummy via pattern arrangement region 143 in which the dummy vias can be arranged in the vicinity of first wirings 101a to 101f and second wirings 102a to 102i extracted in step S201 is extracted, as illustrated in FIG. 24.

Next, in step S205, overlap region 145 of overlap region 142 outputted in step S203 and first dummy via pattern arrangement region 143 outputted in step S204 is extracted, as illustrated in FIG. 25. Overlap region 145 is a region which indicates in detail the region where the dummy vias can be arranged in the vicinity of first wirings 101a to 101f and second wirings 102a to 102i. Further, as illustrated in FIG. 23, first dummy via pattern 147 is arranged for output with respect to overlap region 145, based on a predetermined first dummy via pattern generation specification.

Here, it is preferable that the predetermined first dummy via pattern generation (arrangement) specification be a generation (arrangement) specification which defines the arrangement pitch of the dummy vias so that the density of the dummy vias is the highest in a range in which the design standard for each semiconductor process is complied with.

Next, in step S206, a distant region where the dummy vias can be arranged, from first wirings 101*a* to 101*f* and second wirings 102*a* to 102*i*, with reference to first dummy via pattern arrangement region 143, that is, second dummy via pattern arrangement region 144 is extracted, as illustrated in FIG. 24.

Next, in step S207, overlap region 146 of both overlap region 142 outputted in step S203 and second dummy via pattern arrangement region 144 outputted in step S206 is extracted, as illustrated in FIG. 25. Overlap region 146 is a region which indicates in detail the region where the dummy vias can be arranged in the distant region, with reference to first dummy via pattern arrangement region 143, from first wirings 101*a* to 101*f* and second wirings 102*a* to 102*i*. Further, as illustrated in FIG. 23, second dummy via pattern 148 is arranged for output with respect to overlap region 146, based on a predetermined second dummy via pattern generation specification.

Here, it is preferable that the predetermined second dummy via pattern generation specification be a dummy via generation specification which defines the arrangement pitch of minimum dummy vias which is necessary to achieve the lower limit value of the density of the dummy vias regulated by the design standard for each semiconductor process.

By performing the above-mentioned steps S201 to S207, as illustrated in FIG. 23, it is possible to arrange first dummy via pattern 147 in first dummy via pattern arrangement region 143 in the vicinity of first wirings 101*a* to 101*f* and second wirings 102*a* to 102*i* in high density. Further, simultaneously, it is possible to arrange second dummy via pattern 148 in second dummy via pattern arrangement region 144 which is the distant area from first wirings 101*a* to 101*f* and second wirings 102*a* to 102*i* with reference to first dummy via pattern arrangement region 143 in low density.

As described above, in the semiconductor device (semiconductor integrated circuit) designed according to the method of the present exemplary embodiment, it is possible to arrange the high density dummy via pattern in the vicinity region of the first and second wirings, and to arrange the low density dummy via pattern in the distant region, with reference to the vicinity region of the first and second wirings. Thus, it is possible to comply with the design standard regulated for each semiconductor process without surplus arrangement of the dummy vias. That is, it is possible to suppress expansion of the file size of the layout CAD data to be stored while complying with the design standard regulated for each semiconductor process.

In the present exemplary embodiment, the first dummy wiring pattern generated in the first wiring layer and the second dummy wiring pattern generated in the second wiring layer respectively have the different original points arranged with a uniform pitch, but the arranged original points may be the same.

Further, in the respective exemplary embodiments, the second wiring layer is formed with the interlayer insulation film being disposed on the top layer of the first wiring layer, but the hierarchical relationship of the first wiring layer and the second wiring layer may be changed.

Further, in the respective exemplary embodiments, being in the vicinity or outside the vicinity has been determined with respect to both of the first wiring pattern and the second wiring pattern, but being in the vicinity or outside the vicinity may be determined using any one wiring pattern. Here, it is preferable that being in the vicinity or outside the vicinity be determined using both of the first wiring pattern and the second wiring pattern.

Further, the dummy via pattern may not be arranged in the overlap region of the first and second dummy wiring patterns, but may be connected to only the first dummy wiring pattern or the second dummy wiring pattern. Here, it is preferable to arrange the dummy via pattern in the overlap region of the first and second dummy wiring pattern.

Further, a part or all of the first and second dummy wiring patterns may be connected to a wiring which does not electrically function as a circuit, for example, a ground wiring which is a wiring through which a signal for operating the circuit does not pass.

Further, in the above-mentioned respective exemplary embodiments, with respect to the respective wirings and the respective wiring patterns described with the uniform pitch, wiring width, and/or wiring interval, unevenness may occur by operations or the like of the manufacturing process, which is not problematic.

Further, the present invention is not limited to the above-mentioned respective embodiments, and may be appropriately modified by those skilled in the art in a range without departing from the spirit of the present invention.

Further, a configuration may be used in which the first dummy wirings which form first dummy wiring pattern 140 and the second dummy wirings which form second dummy wiring pattern 141 are the same in length of one side of the rectangular shape and are the same in length of the other side thereof, and are the same in pitch in the row direction and are the same in pitch in the column direction.

Further, in the first exemplary embodiment and the second exemplary embodiment, it is preferable that the centers of the overlap regions of the first dummy wiring and the second dummy wiring coincide with the centers of the dummy vias.

Further, in the first exemplary embodiment illustrated in FIG. 1, first dummy wiring pattern 104 which extends in the column direction and includes the plurality of first dummy wirings arranged in parallel with the first uniform pitch and second dummy wiring pattern 106 which extends in the row direction and includes the plurality of second dummy wirings arranged in parallel with the second uniform pitch are provided. Further, a configuration may be used in which the first and second dummy via patterns have the first dummy vias arranged in the respective row and column directions with a pitch of N times (N is a positive integer) the first pitch and the second pitch in the overlap region where the first dummy wiring pattern and the second dummy wiring pattern overlap with each other. Further, preferably, N is an even number, and a configuration may be used in which first and second dummy via patterns 121 and 124 have the second dummy vias which are arranged in the overlap regions which are positioned at intersections of a plurality of first virtual lines passing through central points of two first dummy vias which are adjacent to each other in the row direction and respectively extending in the column direction and a plurality of second virtual lines passing through central points of two first dummy vias which are adjacent to each other in the column direction and respectively extending in the row direction, in addition to the first dummy vias. The same configuration may be used with respect to the exemplary embodiment illustrated in FIG. 22 and the exemplary embodiment illustrated in FIG. 23.

According to the semiconductor device according to the present invention, it is possible to effectively reduce manufacturing defects such as via defects or contact defects, and to suppress expansion of the file size of layout CAD data in a design process of the semiconductor device, which is useful for a semiconductor integrated circuit or the like including an LSI, for example.

What is claimed is:

1. A semiconductor device including a substrate, and first and second wiring layers formed on the substrate, comprising:
   a first wiring formed in the first wiring layer;
   an interlayer insulation film formed between the first wiring layer and the second wiring layer;
   a second wiring formed in the second wiring layer;
   a via formed through the interlayer insulation film and connecting the first wiring to the second wiring; and
   a dummy pattern region in which first dummy wirings formed in the first wiring layer, second dummy wirings formed in the second wiring layer, and dummy vias formed through the interlayer insulation film and connecting the first dummy wirings to the second dummy wirings are disposed, wherein:
   the first and second wirings constitute a functionable circuit,
   the dummy pattern region includes a first dummy via region and a second dummy via region,
   the first dummy via region is located closer to the first and second wirings than the second dummy via region,
   a number of the dummy vias per area in the first dummy via region is higher than a number of the dummy vias per area in the second dummy via region and in a planar view, a center of an overlap region of one of the first dummy wirings and one of the second dummy wirings coincides with a center of one of the dummy vias.

2. The semiconductor device according to claim 1, wherein a distance between the dummy vias in the first dummy via region is shorter than a distance between the dummy vias in the second dummy via region.

3. The semiconductor device according to claim 1, wherein an extending direction of the first dummy wirings and an extending direction of the second dummy wirings are orthogonal to each other, in a planar view.

4. The semiconductor device according to claim 3, wherein:
   the dummy vias are disposed at cross points of the first dummy wiring and the second dummy wirings, and
   at a minimum, in the second dummy via region, some of the cross points have no dummy via.

5. The semiconductor device according to claim 1, wherein, in a planar view, an extending direction of the first dummy wirings is in parallel with a priority wiring direction in the first wiring layer, and an extending direction of the second dummy wirings is in parallel with a priority wiring direction in the second wiring layer.

6. The semiconductor device according to claim 1, wherein, in a planar view, an extending direction of the first dummy wirings is orthogonal to a priority wiring direction in the first wiring layer, and an extending direction of the second dummy wirings is orthogonal to a priority wiring direction in the second wiring layer.

7. The semiconductor device according to claim 1, wherein the first dummy wirings are arranged in parallel and have a first constant pitch, in a planar view.

8. The semiconductor device according to claim 7, wherein each of the first dummy wirings has a same wiring width.

9. The semiconductor device according to claim 7, wherein:
   a plurality of the first wirings are provided,
   each of the first dummy wirings has a wiring width which is a same as a minimum wiring width among wiring widths of the first wirings, and
   a wiring interval of the first dummy wirings is a same as a minimum interval among wiring intervals of the first wirings.

10. The semiconductor device according to claim 7, wherein:
    a plurality of the first wirings are provided and arranged in parallel in a planar view, and have a constant pitch, and
    the first pitch of the first dummy wirings is an integral multiple of the pitch of the first wirings.

11. The semiconductor device according to claim 1, wherein the second dummy wirings are arranged in parallel in a planar view and have a second constant pitch.

12. The semiconductor device according to claim 11, wherein each of the second dummy wirings has a same wiring width.

13. The semiconductor device according to claim 11, wherein:
    a plurality of the second wirings are provided,
    each of the second dummy wirings has a wiring width which is a same as a minimum wiring width among wiring widths of the second wirings, and
    a wiring interval of the second dummy wirings is a same as a minimum interval among wiring intervals of the second wirings.

14. The semiconductor device according to claim 11, wherein:
    a plurality of the second wirings are provided and arranged in parallel in a planar view, and have a constant pitch, and
    the second pitch of the second dummy wirings is an integral multiple of the pitch of the second wirings.

15. The semiconductor device according to claim 1, wherein the first and second dummy wirings have a rectangular shape and are arranged in a matrix form with a constant pitch.

16. The semiconductor device according to claim 15, wherein the first dummy wirings and the second dummy wirings are same in length of one side of the rectangular and in length of the other side of the rectangular, and are same in a row-directional pitch and in a column-directional pitch.

17. The semiconductor device according to claim 1, wherein the first dummy via region surrounds the second dummy via region in a planar view.

18. The semiconductor device according to claim 1, wherein the first wiring partially overlaps with the second dummy wirings and the second wiring partially overlaps with the first dummy wirings, in a planar view.

19. The semiconductor device according to claim 1, wherein the dummy pattern region is located in a circuit area.

20. A semiconductor device including a substrate, and first and second wiring layers formed on the substrate, comprising: a first wiring formed in the first wiring layer; an interlayer insulation film formed between the first wiring layer and the second wiring layer; a second wiring formed in the second wiring layer; a via formed through the interlayer insulation film and connecting the first wiring to the second wiring; and a dummy pattern region in which first dummy wirings formed in the first wiring layer, second dummy wirings formed in the second wiring layer, and dummy vias formed through the interlayer insulation film and connecting the first dummy wirings to the second dummy wirings are disposed, wherein:
the first and second wirings constitute a functionable circuit,
the dummy pattern region includes a first dummy via region and a second dummy via region, the first dummy via region is located closer to the first and second wirings than the second dummy via region, a number of the dummy vias per area in the first dummy via region is higher than a number of the dummy vias per area in the second dummy via region, and in a planar view:
- the first dummy wirings extend in a column direction and are arranged in parallel with a first pitch,
- the second dummy wirings extend in a row direction and are arranged in parallel with a second pitch, and
- the dummy vias include first dummy vias arranged in the respective row and column directions, with a pitch of N multiples (N is a positive integer) of the first pitch and the second pitch, in overlap regions where the first dummy wirings and the second dummy wirings overlap with each other.

21. The semiconductor device according to claim 20, wherein:
- the N is an even number, and
- in a planar view, the dummy vias further include second dummy vias arranged in overlap regions positioned at intersections of a plurality of first virtual lines passing through central points of two first dummy vias adjacent to each other in the row direction and respectively extending in the column direction and a plurality of second virtual lines passing through central points of two first dummy vias adjacent to each other in the column direction and respectively extending in the row direction.

22. The semiconductor device according to claim 20, wherein an extending direction of the first dummy wirings and an extending direction of the second dummy wirings are orthogonal to each other, in a planar view.

* * * * *